United States Patent
Klusmann et al.

(10) Patent No.: US 11,473,036 B2
(45) Date of Patent: Oct. 18, 2022

(54) CLEANING SOLUTION FOR CLEANING METAL SURFACES

(71) Applicant: Atotech Deutschland GmbH, Berlin (DE)

(72) Inventors: Eckart Klusmann, Berlin (DE); Janos Hantschick, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 91 days.

(21) Appl. No.: 16/624,960

(22) PCT Filed: Jul. 4, 2018

(86) PCT No.: PCT/EP2018/068059
§ 371 (c)(1),
(2) Date: Dec. 20, 2019

(87) PCT Pub. No.: WO2019/008016
PCT Pub. Date: Jan. 10, 2019

(65) Prior Publication Data
US 2020/0140782 A1 May 7, 2020

(30) Foreign Application Priority Data
Jul. 4, 2017 (EP) .................... 17179457

(51) Int. Cl.
*C11D 1/72* (2006.01)
*C11D 1/722* (2006.01)
(Continued)

(52) U.S. Cl.
CPC .............. *C11D 1/8255* (2013.01); *B08B 3/08* (2013.01); *C11D 3/042* (2013.01); *C11D 3/2068* (2013.01);
(Continued)

(58) Field of Classification Search
CPC ........... C11D 1/72; C11D 1/722; C11D 1/825; C11D 3/042
See application file for complete search history.

(56) References Cited

U.S. PATENT DOCUMENTS 3,650,965 A * 3/1972 Cantor .................. C11D 3/485
510/234
5,558,109 A 9/1996 Cala et al.
(Continued)

FOREIGN PATENT DOCUMENTS

EP 2746376 A1 6/2014
JP 08104890 A 4/1996
(Continued)

OTHER PUBLICATIONS

PCT/EP2018/068059; PCT International Search Report and Written Opinion of the International Searching Authority dated Aug. 24, 2018.
(Continued)

*Primary Examiner* — Brian P Mruk
(74) *Attorney, Agent, or Firm* — Renner, Otto, Boisselle & Sklar, LLP

(57) ABSTRACT

Cleaning solution for cleaning and/or wetting metal surfaces, comprising
at least one acid,
a first surfactant, which is an alkyl-poly(ethyleneglycol-co-propyleneglycol)-ether having a cloud point of ≤25° C.,
a second surfactant, which is selected from the group consisting of
i) an alkyl-poly(ethyleneglycol-co-propyleneglycol)-ether having a cloud point of ≥30° C.,
ii) an alkyl-polyethyleneglycol-ether having a cloud point of ≥45° C.
(Continued)

wherein the cloud points are determined according to European Standard EN 1890:2006, item 8.2 of German Version, with the modification that 10 wt % $H_2SO_4$ is used as solvent and that the concentration of the surfactant is 1000 mg/L.

9 Claims, 3 Drawing Sheets

(51) Int. Cl.
| | |
|---|---|
| C11D 1/825 | (2006.01) |
| B08B 3/08 | (2006.01) |
| C11D 3/04 | (2006.01) |
| C11D 3/20 | (2006.01) |
| C11D 3/34 | (2006.01) |
| C11D 11/00 | (2006.01) |
| C23C 18/18 | (2006.01) |
| C23C 18/54 | (2006.01) |
| C23G 1/06 | (2006.01) |
| C25D 5/34 | (2006.01) |
| C25D 7/00 | (2006.01) |
| H05K 3/26 | (2006.01) |

(52) U.S. Cl.
CPC ........ *C11D 3/3454* (2013.01); *C11D 11/0029* (2013.01); *C23C 18/1834* (2013.01); *C23C 18/54* (2013.01); *C23G 1/06* (2013.01); *C25D 5/34* (2013.01); *C25D 7/00* (2013.01); *C11D 1/72* (2013.01); *C11D 1/722* (2013.01); *H05K 3/26* (2013.01)

(56) References Cited

U.S. PATENT DOCUMENTS

| | | | |
|---|---|---|---|
| 5,877,134 A | * | 3/1999 | Scheper ............... C11D 3/3942 510/220 |
| 6,034,044 A | | 3/2000 | Scheper et al. |
| 8,216,992 B2 | | 7/2012 | Hatch et al. |
| 2002/0037821 A1 | * | 3/2002 | Renfrow ................ C11D 1/94 510/234 |
| 2004/0163671 A1 | | 8/2004 | Fournel et al. |
| 2008/0167215 A1 | | 7/2008 | Bittner et al. |
| 2008/0200360 A1 | | 8/2008 | Beck et al. |
| 2010/0240752 A1 | | 9/2010 | Dreilinger et al. |
| 2013/0252874 A1 | | 9/2013 | Hulskotter et al. |

FOREIGN PATENT DOCUMENTS

| | | |
|---|---|---|
| JP | 2000336391 A | 12/2000 |
| JP | 2003277800 A | 10/2003 |
| JP | 2010077342 A | 4/2010 |
| JP | 2016011436 A | 1/2016 |

OTHER PUBLICATIONS

PCT/EP2018/068059; PCT International Preliminary Reporton Patentability dated Jun. 17, 2019.
Office Action for corresponding Chinese Application No. 201880044023.9 dated Aug. 4, 2020.
Search Report for corresponding Taiwanese Application No. 107123090 dated Oct. 20, 2021.
Search Report for corresponding Japanese Application No. 2019-572604 dated Dec. 6, 2021.

* cited by examiner

CLEANING SOLUTION FOR CLEANING METAL SURFACES

The present application is a U.S. National Stage Application based on and claiming benefit and priority under 35 U.S.C. § 371 of International Application No. PCT/EP2018/068059, filed 4 Jul. 2018, which in turn claims benefit of and priority to European Application No. 17179457.1 filed 4 Jul. 2017, the entirety of both of which is hereby incorporated herein by reference.

FIELD OF THE INVENTION

The present invention relates to a cleaning solution for cleaning metal surfaces and to a process for cleaning a metal surface using said cleaning solution.

A significant precondition for successful plating of printed circuit boards (PCB) is efficient surface pretreatment. Cleaning of a surface is done during the manufacture of PCB before a metal layer is deposited on a surface of the PCB. Cleaning leads to a better adhesion of a deposited metal layer on the surface and leads to a deposited layer that is free or substantially free of defects.

BACKGROUND OF THE INVENTION

Numerous cleaning solutions are known from the state of the art.

US 2008/0200360 A1, for example, discloses an aqueous solution for removing ionic contaminants from the surface of a workpiece having a solder resist mask and a surface top layer, the solution containing: a) at least one first compound selected from the group comprising ethanolamine compounds and the salts thereof and b) at least one second compound selected from the group comprising alcoholic solvents.

Cleaning solutions often comprise a surfactant. Cleaning solutions should show a good wetting of surfaces.

The cloud point of a surfactant designates the temperature when a surfactant forms larger micelles, or even phase separation, leading to cloudiness of the solution. Cleaning properties of the solution are good, when the solution is applied at a temperature that is below or around the cloud point. Cleaning properties are best, when the temperature of the solution is slightly above the cloud point. It is desired that a cleaning solution is used at elevated temperature in order to reach a good cleaning result. And it is beneficial when said elevated temperature corresponds to the cloud point, or is only slightly higher. If the cloud point is low, the processing temperature will exceed the cloud point too much and cloudiness will make the solution ineffective and deteriorates its cleaning properties. So, it is desired that the cloud point is elevated and that it is about the same temperature as the processing temperature.

OBJECTIVE OF THE PRESENT INVENTION

It is therefore an object of the invention to provide with a cleaning solution having good cleaning properties, in particular at elevated temperatures.

It is a further object of the invention to provide with a cleaning solution having good wetting properties, in particular at elevated temperatures.

It is a further object of the invention to provide with a cleaning solution having good cleaning properties and a high cloud point.

It is a further object of the invention to provide with a cleaning solution having good wetting properties and a high cloud point.

SUMMARY OF THE INVENTION

The solution of this object is achieved by a cleaning solution as set forth in claim 1. Further embodiments are subject matter of dependent claims.

The present invention provides with a cleaning solution for cleaning and/or wetting metal surfaces, comprising
- at least one acid, preferably an inorganic acid and/or methane sulfonic acid,
- a first surfactant, which is an alkyl-poly(ethyleneglycol-co-propyleneglycol)-ether having a cloud point of ≤25° C., preferably ≤23° C., and
- a second surfactant, which is selected from the group consisting of
  - i) an alkyl-poly(ethyleneglycol-co-propyleneglycol)-ether having a cloud point of ≥30° C., preferably ≥35° C.; and
  - ii) an alkyl-polyethyleneglycol-ether having a cloud point of ≥45° C., preferably ≥50° C., more preferably ≥55° C., even more preferably ≥60° C.;

wherein the cloud points are determined according to European Standard EN 1890:2006, item 8.2 of German Version, with the modifications that 10 wt % $H_2SO_4$ is used as solvent and that the concentration of the surfactant is 1000 mg/L.

With the cleaning solution of the invention good and fast wetting and cleaning, a high cloud point of the solution, good and fast removal of the solution after use, and low foam formation can be obtained.

DETAILED DESCRIPTION OF THE INVENTION

Figure 1:
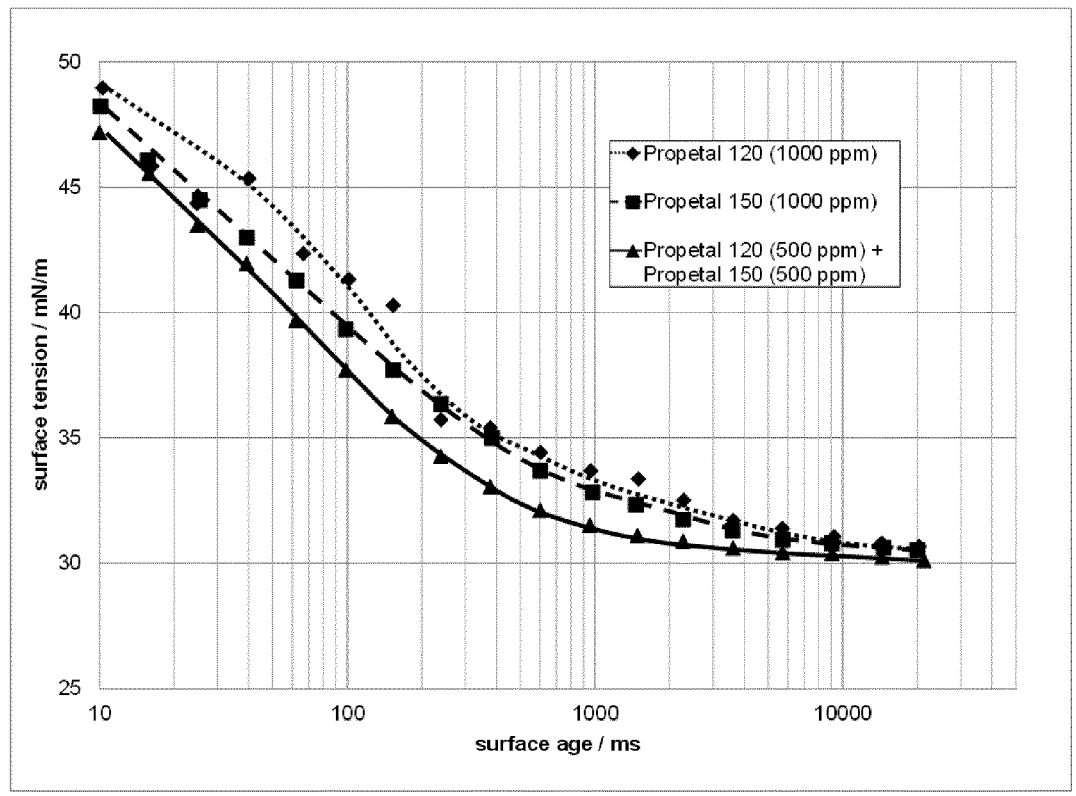
FIG. 1 dynamic surface tension of an inventive mixture of surfactants in comparison to the individual surfactants, FIG. 2 dynamic surface tension of an inventive mixture of surfactants in comparison to the individual surfactants, FIG. 3 dynamic surface tension of a mixture of surfactants (comparative example) in comparison to the individual surfactants, FIG. 4 cleaning results obtained using inventive cleaning solutions and comparative cleaning solutions, FIG. 5 cross-section of a through hole, (1) solder within through hole, (2) base material with glass fibers, (3) stack of copper layers deposited onto wall of through hole, (4) inner copper layer.

It has been shown that with a cleaning solution of the invention, in the general or in specific embodiments, one or more of the following benefits can be obtained:

Good and fast cleaning of metal surfaces. Organic contaminations and inorganic contaminations are removed excellently and fast from a metal surface by the cleaning solution of the invention. Examples of organic contaminations are remaining particles of photo resists, finger prints, glove prints, the latter resulting from components the gloves are made of, or organic material resulting from previous production steps like lubricating grease. Inorganic contaminations may be metal oxides which form on metal surfaces if the metal surfaces are in contact with oxygen, e.g. resulting from air, for some time. Inorganic contaminations may also result from previous production steps, like carbonate residues formed during development of photo resists. Cleaning leads to a better adhesion of a metal layer deposited on the metal surface and leads to a deposited layer that is free or substantially free of defects.

Good wetting properties. Good wetting properties lead to effective and uniform cleaning of a surface. When rinsing the surface with water in a next step, after cleaning, water is more uniformly distributed over the surface and wetting with water is improved, particularly in the region of blind micro vias (vertical interconnect access) and through holes. Moreover, the surface becomes better and more uniformly accessible for chemicals that are used in still further processing steps, e.g. chemicals of a copper deposition bath. Further, fast wetting can be obtained making the cleaning solution of the invention particularly suited for being applied within an industrial manufacturing process, e.g. for PCBs.

A high cloud point of the solution. Therefore, the cleaning solution can be used effectively at elevated temperatures.

Good and fast removal of the cleaning solution after use. Removal is important since surfactant remaining on the metal surface deteriorates metal adhesion in further processing steps. Moreover, removal of the solution should be possible in a short time, in order to improve the speed of the whole process.

Low foam formation. Foam is a drawback in processing. First, foam causes that the level of the solution falls, which is a drawback in the cleaning process. Secondly, foam has to be removed in order to avoid drawbacks on following processing steps, such as metallization. Foam removal however, is burdensome in terms of time and cleaning water consumption.

Moreover, it has surprisingly been shown that a synergistic effect in wetting properties, i.e. a synergistic effect on the surface tension, is obtained in the cleaning solution. When adding the above-mentioned surfactants in combination, a lower surface tension is obtained in the mixture than could be expected or predicted from the combined surface tensions of the surfactants. This is shown and explained in more detail in the appended examples.

The cleaning solution is preferably an aqueous cleaning solution, in other words based on water as solvent. Preferably, in the composition of the cleaning solution the balance is water adding up to the further ingredients to 100 wt.-%.

As stated above, the cleaning solution for cleaning and/or wetting metal surfaces comprises at least one acid. Preferably, the concentration of the at least one acid ranges from 1 to 50 wt.-%, more preferably from 5-30 wt.-%, even more preferably from 5-20 wt.-% of the cleaning solution of the invention.

The at least one acid is preferably an inorganic acid and/or methane sulfonic acid. As an inorganic acid, sulphuric acid, hydrochloric acid, sulfamic acid ($H_3NSO_3$) or phosphoric acid can be employed, wherein sulphuric acid is preferred. The at least one acid within the cleaning solution of the invention is of advantage as it simultaneously activates the metal surface or prevents passivation of the metal surface. If metal surfaces like copper surfaces are exposed to oxygen, e.g. originating from air, for prolonged time, metal oxides, e.g. CuO, are formed on the metal surface. The metal oxide layers passivate the subjacent metal surface meaning that deposition and adhesion of further metal layers onto the metal surface are impaired or prevented. Advantageously, the at least one acid within the cleaning solution of the present invention removes metal oxides and carbonates from the metal surface and simultaneously the cleaning solution removes organic contaminations from the metal surface.

Further, the at least one acid adjusts the pH of the cleaning solution for cleaning and/or wetting metal surfaces to low pH values. Preferably, the pH value of the cleaning solution of the invention is below 2.0, more preferably between 0 to 2.0, even more preferably between 0 to 1.5. The low pH value of the cleaning solution of the present invention is also of advantage since it prevents photo resists possibly present on at least part of the metal surface from being attacked or removed from the metal surface.

Specific embodiments of the cleaning solution of the invention are given below. The embodiments can be performed singly or in any combination. The limits of the ratios and ranges disclosed herein may be combined in any combination.

In a specific embodiment the mass ratio of the first surfactant to the second surfactant in the cleaning solution is in the range of 1:0.5 to 1:10, preferably 1:1 to 1:8, more preferably 1:2 to 1:6, even more preferably 1:2 to 1:4, most preferably 1:3 to 1:4.

In a further embodiment, the concentration of the first surfactant in the cleaning solution is 50-5000 mg/L, preferably 100-1500 mg/L, more preferably 100-1000 mg/L, even more preferably 150-750 mg/L.

In still a further embodiment, the concentration of the second surfactant in the cleaning solution is 50-20000 mg/L, preferably 100-4000 mg/L, more preferably 300-2800 mg/L, even more preferably 300-2400 mg/L, most preferably 500-2000 mg/L.

Hereinafter, preferable embodiments of the first and the second surfactant are described:

As stated above, the first surfactant is an alkyl-poly(ethyleneglycol-co-propyleneglycol)-ether. The alkyl group can have from 6 to 30 carbon atoms, preferably 6 to 22 carbon atoms, more preferably 8 to 15 carbon atoms. In the first surfactant, a mixture of molecules with different alkyl groups can be present. Preferably, the alkyl group is a linear, non-branched alkyl group.

In a further embodiment, the alkyl group preferably is one or more (if different alkyl groups are present) of a branched alkyl group. In another embodiment, the alkyl group mainly consists of one or more branched alkyl groups, which means that unbranched alkyl groups may be present in minor amount. A highly preferred first surfactant comprises or consists of iso-decyl-poly(ethyleneglycol-co-propyleneglycol)-ether. When the first surfactant comprises iso-decyl-poly(ethyleneglycol-co-propyleneglycol)-ether, said compound is the main compound, i.e. the first surfactant mainly comprises said compound.

The poly(ethyleneglycol-co-propyleneglycol)-moiety of the first surfactant may have a statistical length and mass distribution. So, in the first surfactant, a mixture of molecules with differing length of the poly(ethyleneglycol-co-propyleneglycol)-moiety can be present. This can be combined with different alkyl groups, as stated above. So, the first surfactant may vary both in the alkyl-moiety and in the poly(ethyleneglycol-co-propyleneglycol)-moiety.

Therefore, the first surfactant is preferably a mixture of molecules with different molecular mass, in other words with statistic distribution of molar mass. Preferably, the first surfactant has a molecular weight in the range of 350-950 g/mol. The maximum of the molecular weight distribution curve is preferably between 500-600 g/mol, more preferably 500-560 g/mol.

The first surfactant is preferably selected from Marlox MO 154 (Sasol Germany GmbH, CAS 68439-51-0), Marlox FK 64 (Sasol Germany GmbH, CAS 68154-97-2), Antarox B12DF (Solvay Solutions Nederland B.V., CAS 37311-00-5), Propetal 120, Propetal 105 (CAS 155683-77-5 or CAS 154518-36-2), and Dehypon 2574 (BASF); more preferably from Propetal 120 and Propetal 105.

As stated above, the second surfactant can be:
i) an alkyl-poly(ethyleneglycol-co-propyleneglycol)-ether, or
ii) an alkyl-polyethyleneglycol-ether.

In surfactant i), the alkyl group has preferably 6 to 22 carbon atoms, more preferably 8 to 18 carbon atoms. In the surfactant, a mixture of molecules with different alkyl groups can be present. Preferably, the alkyl group is a linear, non-branched alkyl group.

The poly(ethyleneglycol-co-propyleneglycol)-moiety of surfactant i) may have a statistical length and mass distribution. So, in surfactant i), a mixture of molecules with different length of the poly(ethyleneglycol-co-propyleneglycol)-moiety can be present. This can be combined with different alkyl groups, as stated above. So, surfactant i) may vary both in the alkyl-moiety and in the poly(ethyleneglycol-co-propyleneglycol)-moiety.

Therefore, surfactant i) is preferably a mixture of molecules with different molecular mass, in other words with statistic distribution of molar mass. Preferably, second surfactant i) has a molecular weight in the range of 500-1200 g/mol. The maximum of the molecular weight distribution curve is preferably between 700-900 g/mol, more preferably 750-880 g/mol.

The second surfactant i) is preferably selected from Propetal 140, Propetal 150, Simulsol DR 301, and Imbentin PPF.

In surfactant ii), the alkyl group has preferably 8 to 18 carbon atoms, more preferably 10 to 15 carbon atoms. In the surfactant, a mixture of molecules with different alkyl groups can be present. The alkyl group may be one or more (if different alkyl groups are present) of a branched alkyl group. In another embodiment, the alkyl group mainly consists of one or more branched alkyl groups, which means that unbranched alkyl groups may be present in minor amount. A highly preferred surfactant ii) comprises or consists of iso-tridecyl-polyethyleneglycol-ether. When surfactant ii) comprises iso-tridecyl-polyethylene-glycol-ether, said compound is the main compound, i.e. surfactant ii) mainly comprises said compound.

The polyethyleneglycol-moiety of surfactant ii) may have a statistical length and mass distribution. Preferably, the polyethyleneglycol-moiety of surfactant ii) consists of 5 to 22 ethyleneglycol-units, more preferably of 6-15 ethyleneglycol-units. A maximum of the statistical distribution is preferably at 9-11 ethyleneglycol-units. So, in surfactant ii), a mixture of molecules with different length of the polyethyleneglycol-moiety can be present. This can be combined with different alkyl groups, as stated above. So, surfactant ii) may vary both in the alkyl-moiety and in the polyethyleneglycol-moiety.

Therefore, surfactant ii) is preferably a mixture of molecules with different molecular mass, in other words with statistic distribution of molar mass. Preferably, second surfactant ii) has a molecular weight in the range of 400-1000 g/mol. The maximum of the molecular weight distribution curve is preferably between 650-750 g/mol, more preferably 680-720 g/mol.

The second surfactant ii) is preferably selected from Mulsifan RT 203/80, Marlipal 013/90, Surfaline OX 1006 L, Surfaline OX 1309 L and Genapol UD 079.

Molecular weights are determined with High Performance Liquid Chromatography combined with Mass Spectrometry (HPLC-MS), wherein the mass spectrometry is preferably Electro Spray Ionisation—Time of Flight (ESI TOF)—Mass Spectrometry.

The cleaning solution may comprise as a further component an alkyl glycolether. The alkyl glycolether is no polymer. Preferred alkyl glycolethers are ethylene glycol monomethyl ether, ethylene glycol monoethylether, ethylene glycol monopropyl ether, ethylene glycol monobutylether or diethylene glycol monobutylether. Preferably, the concentration of the alkyl glycolether within the cleaning solution of the invention ranges from 100-5000 mg/L, more preferably from 500-2000 mg/L. Alkyl glycolethers contribute to solubilizing polymeric components and thus help remove organic contaminations like particles of photo resists, glove prints or lubricating grease resulting from previous production steps.

The cleaning solution may comprise as a further component a glycol compound. The glycol compound is no polymer. Preferably, the glycol compound is selected from ethylene glycol, propylene glycol, trimethylene glycol, and neopentyl glycol.

The cleaning solution may comprise as a further component at least one carboxylic acid, provided that the at least one carboxylic acid is different from the at least one acid already mentioned above. Preferred carboxylic acids are formic acid, acetic acid, citric acid, glycolic acid, tartaric acid, maleic acid or fumaric acid. The at least one carboxylic acid contributes to removing organic contaminations like fingerprints. Preferably, the concentration of the at least one carboxylic acid within the cleaning solution of the invention ranges from 0.1-5 wt.-%, more preferably from 0.2-2 wt.-%. If more than one carboxylic acid is contained in the cleaning solution, the total concentration of all carboxylic acids ranges from 0.1-10 wt.-%, more preferably from 0.2-5 wt.-%.

The further components, i.e. alkyl glycolether, glycol compound, carboxylic acid, may be contained within the cleaning solution according to the invention in any combination, i.e. one of the further components, two or three of the further components in any combination, may be contained.

A further subject matter of the present invention is a method for wetting and/or cleaning a metal surface, comprising the step: treating a metal surface with a cleaning solution as described above.

The method is particularly suitable for treating a metal surface like copper, nickel, gold, iron, tin, palladium, ruthenium surfaces or surfaces of alloys of the aforementioned metals; preferably copper or copper alloy surfaces.

Preferably, the metal surface may be a component of a substrate. The substrate may further comprise a base material like a flexible material, such as polyimide; teflon, ceramics, prepregs or silicon wafer. The substrate may be selected from the group of electric circuit carriers such as printed circuit boards (PCBs), copper clad prepregs and chip carriers.

Treatment can be done by any kind of contacting the surface with the cleaning solution, for example, by spraying, dipping, immersing, rinsing or by flooding by submerged sparger nozzles. A preferred technique is dipping. Treatment is preferably done at a temperature of 20-70° C., more preferably 30-60° C., even more preferably 35-50° C. Treatment is preferably done for a time period of 10 seconds to 10 minutes. When only wetting of a surface is desired, treatment time can be short, e g. 10 seconds to 1 minute. When cleaning is desired, a longer treatment time is chosen, e.g. 2 to 10 minutes, preferably 5 to 10 minutes.

As a further step, the method of the invention may comprise: rinsing the metal surface, preferably with water. Rinsing is done after treating the metal surface with a cleaning solution of the invention. Rinsing removes the cleaning solution and contaminations from the metal surface. A benefit of rinsing is removal of undesired surfactant that could negatively affect a subsequent process step. Moreover, removal of the solution is possible in a short time, and thus improves the speed of the whole process. The property of a cleaning solution of being removed by rinsing is called rinsability. Thus, the cleaning solution of the invention has a good and fast rinsability.

When rinsing the metal surface, it stays wetted, until a further process step is performed, such as applying a further layer of metal, applying an isolating layer or etching a structure, such as a micro via. This is a further benefit since the rinsed surface becomes better and more uniformly accessible for chemicals that are used in subsequent processing steps, e.g. chemicals of a metal deposition bath. Rinsing is preferably done with excess of water and a strong flow, in order to effectively remove the cleaning solution.

A further subject matter of the present invention is the use of a cleaning solution of the invention for cleaning and/or wetting a metal surface. Cleaning and/or wetting can be done by any kind of contacting the surface with the cleaning solution, for example, by spraying, dipping, immersing, rinsing or by flooding by submerged sparger nozzles; preferably by dipping, immersing or by flooding by submerged sparger nozzles. A preferred technique is dipping.

A further subject matter of the present invention is a method for depositing a metal layer onto a metal surface, comprising the steps:
  (a) providing a metal surface,
  (b) treating the metal surface with a cleaning solution as described above, and
  (c) treating the metal surface with a metal deposition solution, and thereby depositing the metal layer onto the metal surface.

Preferably, the metal surface may be a component of a substrate. The substrate may further comprise a base material like a flexible material, such as polyimide; teflon, ceramics, prepregs or silicon wafer. The substrate may be selected from the group of electric circuit carriers such as printed circuit boards (PCBs), copper clad prepregs and chip carriers. Preferably, the base material of PCBs or prepregs are made of epoxy based material, e.g. epoxy blends like epoxy-benzotriazole blends, epoxy-cyanate-blends, epoxy-propylene blends, or epoxy-polyimide blends; which may optionally be reinforced with fibrous material like glass fibers or woven glass mats.

The method is particularly suitable for treating a metal surface like copper, nickel, gold, iron, tin, palladium, ruthenium surfaces or surfaces of alloys of the aforementioned metals; preferably copper or copper alloy surfaces.

The metal of the metal layer is preferably selected from the group comprising tin, gold, silver, palladium, copper, nickel, zinc and ruthenium or the alloys thereof, more preferably gold, palladium, copper, nickel or the alloys thereof.

The terms "depositing" and "plating" may be used interchangeably herein.

The metal deposition solution is preferably an aqueous solution, in other words based on water as solvent.

For step (c) several methods for depositing a metal layer onto a metal surface by applying a wet-chemical plating method are known to the person skilled in the art. According to the present invention the wet chemical plating method preferably is an electroplating method, an electroless plating method or an immersion plating method.

Electroplating or electrolytic plating methods are commonly described as plating processes using external current sources. Electroless plating is the controlled autocatalytic deposition of a continuous film of metal without the assistance of an external supply of electrons. In the context of the present invention electroless plating is to be understood as autocatalytic deposition with the aid of a chemical reducing agent (referred to as "reducing agent" herein). Immersion plating or displacement plating is another deposition of metal without the assistance of an external supply of electrons and without chemical reducing agent. The mechanism relies on the substitution of metals from the substrate to be plated for metal ions present in the immersion plating solution.

In electroplating or electrolytic plating methods, the metal deposition solution or liquid contains, in addition to a solvent, water for example, ions of the at least one metal to be deposited as well as at least one component enhancing electrical conductivity of the liquid. The liquid may further contain at least one acid/base adjuster and/or at least one additive influencing the mechanical, electrical, and/or other properties of the metal deposit and/or influencing the thickness distribution of the metal deposit and/or influencing the plating performance of the electroplating liquid including its stability against decomposition like oxidation or the like. The ions of the at least one metal may be hydrated ions or complexed ions. The acid/base adjuster may simply be an acid or a base and/or be a buffer. The component enhancing the electrical conductivity of the liquid may be a metal salt or acid or base. The additives may be brighteners, levelers, antioxidants, carriers, and the like.

Electroplating may be performed by using direct current, alternating current, or pulsed current or pulsed voltage.

Any metal deposition solutions can be used for the electrodeposition, for example for depositing copper, nickel, tin, gold, silver, palladium, zinc and ruthenium or the alloys thereof. This type of electrodeposition solutions is well known to the person skilled in the art.

In a preferred embodiment the electrodeposition of a copper layer onto the metal surface is performed by an electrodeposition method and an electrolytic copper deposition solution already known, like alkaline cyanide or alkaline noncyanide systems, pyrophosphate complex ion systems, or acidic electrolytic copper deposition solutions. Acidic electrolytic copper deposition solutions are preferred. Of these, acid sulfate and fluoroborate copper deposition solutions are preferred, acid sulfate copper deposition solutions are more preferred.

Copper electrodepositing is performed applying an average current density preferably ranging from 0.1-50 A/dm$^2$, more preferably from 0.5-40 A/dm$^2$, even more preferably from 1-25 A/dm$^2$, yet more preferably from 1 A/dm$^2$-15 A/dm$^2$. If a direct current is applied between the metal surface and an anode the average current density corresponds to the applied direct current density. If an alternating or pulsed current is applied the average current density is defined as described by Chandrasekar et al. (M. S. Chandrasekar, Malathy Pushpavanam; Pulse and pulse reverse plating—Conceptual advantages and applications; Electrochimica Acta 53 (2008), 3313-3322; Chapter 5). Copper electrodepositing is preferably performed at a temperature ranging from 5-80° C., more preferably from 10-70° C., even more preferably from 15° C.-60° C., for a time sufficient for obtaining the desired thickness of the deposited copper layer.

In another preferred embodiment the electrodeposition of a nickel layer onto the metal surface is performed by an electrodeposition method and an electrolytic nickel deposition solution already known, like a Watts nickel bath. A Watts nickel bath is normally used as a bright nickel bath which contains nickel sulfate, nickel chloride and boric acid as well as saccharine as an additive.

The overall procedure of the electrodeposition method may contain further optional pre-treatment steps and optional post-treatment steps. Pre-treatment steps may be micro etching or pickling. Then the cleaning solution of the present invention is employed (step (b)). Afterwards, the metal surface may be rinsed with water by one or more rinsing steps, and dried, e.g. air-dried. Then the electrodeposition is carried out (step (c)). Post-treatment steps may be washing the deposited metal layer in water, passivating or drying. Preferably, the metal surface is a component of a substrate.

An alternative to electrodeposition of metals is electroless deposition thereof. The main components of electroless metal deposition solutions are a metal salt of the metal to be deposited, a complexing agent, a reducing agent, and, as optional ingredients, an alkaline, and additives, as for example stabilising agents.

Any metal deposition solutions can be used for the electroless deposition, for example for depositing copper, nickel, tin, gold, silver, palladium and ruthenium or the alloys thereof. Such electroless metal deposition solutions are familiar to those skilled in the art.

In a preferred embodiment the electroless deposition of a copper layer onto the metal surface is performed by an electroless deposition method and an electroless copper deposition solution already known in the art. An electroless copper deposition solution typically contains a copper salt, for example copper sulfate or copper hypophosphite; a reducing agent such as formaldehyde, a hypophosphite salt, for example an alkali or ammonium salt, or hypophosphorous acid, or dimethylamine borane; one or more complexing agents such as tartaric acid, ethylenediamine tetraacetic acid, glycolic acid or triethanolamine; one or more stabilising agents such as oxygen, thiourea, 2-mercaptobenzothiazole, diethyl-dithio-carbamate or vanadium pentoxide; as well as a pH adjusting agent such as sodium hydroxide or potassium hydroxide. Optionally, the electroless copper deposition solution contains brighteners and/or wetting agents. The solvent will be, in general, water.

In another preferred embodiment the electroless deposition of a nickel layer onto the metal surface is performed by an electroless deposition method and an electroless nickel deposition solution already known in the art. An electroless nickel deposition solution contains a number of substances including a nickel salt like nickel sulfate, nickel chloride, nickel acetate or nickel hypophosphite; a reducing agent like a hypophosphite salt, for example an alkali salt like sodium hypophosphite or an ammonium salt, sodium borohydride, dimethylamine borane or hydrazine; complexing agents like alkyl amines, ammonia, carboxylic acids, hydroxyl carboxylic acids, aminocarboxylic acids or their salts; stabilising agents like compounds of Group VI elements: S, Se, Te, compounds containing oxygen: $AsO_2^-$, $IO_3^-$, $MoO_4^{2-}$, heavy metal cations: $Sn^{2+}$, $Pb^{2+}$, $Hg^+$, $Sb^{3+}$, or unsaturated organic acids: maleic acid, itaconic acid; and pH adjusting agents (for example a buffer). Electroless deposition of a nickel layer is usually performed at higher temperatures, i.e. at a temperature ranging from 20° C. to 90° C.

The overall procedure of the electroless deposition method may contain further optional pre-treatment steps and optional post-treatment steps. The metal surface is cleaned employing the cleaning solution of the present invention (step (b)). Then pre-treatment steps like a desmear step or an activation step may be performed. Afterwards, the metal surface may be rinsed with water by one or more rinsing steps, and dried. Then the electroless deposition is carried out (step (c)). Preferably, the metal surface is a component of a substrate.

In still another preferred embodiment the metal deposition is performed by immersion plating or displacement plating. Typical thicknesses to by achieved vary from 10-200 µm.

Immersion deposition of a metal layer onto the metal surface may be performed by an immersion deposition method and an immersion metal deposition solution already known in the art. An immersion metal deposition solution is usually an aqueous solution comprising a metallic salt of the metal to be deposited like metal cyanides, sulfates, chlorides or nitrates; complexing agents like alkali metal cyanides, ammonium, tartrate, alkali metal thiosulfate or thiourea; and pH adjusting agents like alkali metal hydroxide, ammonium, carbonates, sulfuric acid or hydrochloric acid. Any metal deposition solutions can be used for the immersion deposition, for example for depositing tin, gold, silver and nickel or alloys thereof. Temperature of deposition may vary broadly, e.g. may range from 10 to 150° C., and depends on the metal to be deposited.

The general procedure of the immersion deposition method may contain further optional pre-treatment steps and optional post-treatment steps. Pre-treatment steps may be pickling the metal surface; washing in water; polishing to a bright finish. Then the cleaning solution of the present invention is employed (step (b)). Afterwards, the metal surface may be washed; and dipped in cyanide or acid solution, depending on whether the immersion deposition solution to be used later may be alkaline cyanide or acidic. Then the immersion deposition is carried out (step (c)). Post-treatment steps may be washing the deposited metal layer in water and drying. Preferably, the metal surface is a component of a substrate.

Figure 5:
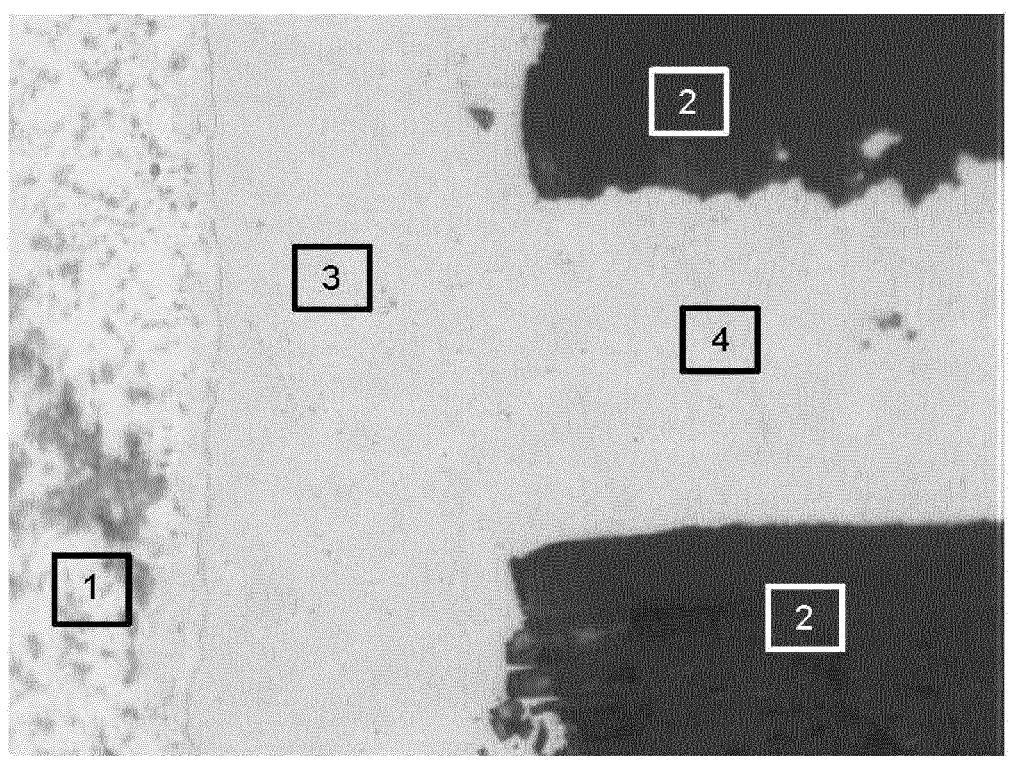

Treating the metal surface with the cleaning solution of the present invention improves adhesion of a metal layer deposited onto the metal surface. This is shown in FIG. 5. FIG. 5 shows a cross section of a part of a through hole present in a multi layer PCB. This multi layer PCB comprises at least three layers of base material (2) and at least two layers of copper circuit lines, each layer of copper circuit lines being present between two layers of the base material. These layers of copper circuit lines are called inner copper layers (4). The base material (2) is glass fiber reinforced. The outer surfaces of the outer layers of base material may be clad with copper foil (not shown in FIG. 5). The through hole passes through these layers. The walls of the through hole are deposited with a stack (3) of an electrolessly deposited copper layer and an electrodeposited copper layer. The electrolessly deposited copper layer is applied directly onto the walls of the through hole and the electrodeposited copper layer is plated onto the electroless copper layer. The remaining space within the through hole is filled with solder (1). Prior to depositing the electrodeposited copper layer, the surface of the electrolessly deposited copper layer was cleaned with a cleaning solution of the present invention as described by Example 2.4 herein. After depositing the electrodeposited copper layer, the solder (1)

infiltrated the through hole during a solder shock test as described in the same Example 2.4. The contact area between the inner copper layer (4) and the stack (3) of deposited copper layers is called an interconnection or interconnect. FIG. 5 shows that no defects like delaminations or voids occurred at the interconnection or at the contact area between electrolessly and electrodeposited copper layer during the solder shock test. This means that the cleaning solution, the cleaning method and the cleaning step of the metal deposition method of the present invention have excellent cleaning and wetting properties and excellent rinsability.

The method for depositing a metal layer onto a metal surface according to the present invention may comprise the further step of
  (d) bonding the metal surface to a resist material and imaging the resist material.

The further method step (d) may be performed between method steps (b) and (c) or after method step (c), or between method steps (b) and (c) and after method step (c). Method steps (b), (c) and (d) may be repeated or method steps (b) and (c) may be repeated.

Treating the metal surface with the cleaning solution of the present invention also improves adhesion of the resist material to the metal surface.

The resist material may be photo imageable resists or solder resists.

Methods of preparing a metal surface, e.g. a copper clad printed circuit board material, for subsequently coating the surface thereof with a resist material are known in the art. At various stages in the process of manufacturing printed circuit boards, resists are coated to the metal surface, e.g. a copper surface, of the printed circuit board material and must adhere to the metal surface. For example, in creating metal structures, i.e. copper lines, as well as bonding and soldering pads, a photo imageable resist is used to define these structures. Furthermore, after these metal structures have been created, a solder mask is applied to the structures in those regions which shall not be soldered. In both cases, the resist is applied to the metal surface and must well adhere thereto both during the imaging process (exposing and developing) and during any subsequent process steps, like plating of further metal layers such as copper (in the course of copper structure generation) and soldering. Imaging processes of resist material are known in the art. For this reason, cleaning of the metal surfaces is at all events to be performed in order to prepare e.g. a metal surface for a good resist reception and hence adherence thereon.

In a preferred embodiment photo imageable resists, also called plating resist or etching resist, are usually acrylic-based resists, i.e. they have an acrylic or methacrylic backbone. These resists are usually applied to the metal surface as a dry film or a liquid film.

In another preferred embodiment solder resists, also called solder masks or solder stop masks, are polymer layers. The polymers for solder masks are based on epoxy resins.

Solder masks may be bonded in different ways onto the metal surface. Solder masks may be applied as a liquid that is silkscreen printed onto the metal surface. Other types are liquid photoimageable solder masks (LPSM) inks and dry film photo imageable solder masks (DFSM). LPSM can be silkscreen printed or sprayed on the circuit carrier, exposed and developed to provide openings in the conductive line pattern for parts to be soldered to the metal pads. A DFSM is vacuum laminated onto metal surface, then exposed and developed. Afterwards, the polymer layer of the solder mask is thermally cured.

The solder resist has to withstand soldering conditions, like high temperatures, and remains on the metal surface of a circuit carrier after the manufacturing process throughout the whole lifetime of the circuit carrier.

Examples

The present invention is now further described by working examples.

1. Materials and Methods 1.1 Surfactants

As the so-called first surfactant, the following surfactants were used throughout the Examples:

Propetal 120 and Propetal 105 are products and trademarks of Zschimmer and Schwarz Company, Lahnstein, Germany. Propetal 120 and Propetal 105 (CAS 154518-36-2 or 155683-77-5) are ethoxylated/propoxylated fatty alcohols.

Antarox B12DF is a product and trademark of Solvay Solutions Nederland B.V. (CAS 37311-00-5). Antarox B12DF is an ethoxylated/propoxylated dodecanol. Antarox B12DF is hereinafter abbreviated as Antarox.

Marlox MO 154 is a product and trademark of Sasol Germany GmbH (CAS 68439-51-0). Marlox MO 154 is an ethoxylated/propoxylated alcohol, wherein the alcohol moiety has 12 to 14 carbon atoms. Marlox MO 154 is hereinafter abbreviated as Marlox.

As the so-called second surfactant, alternative i), the following surfactants were used throughout the Examples:

Propetal 140 and Propetal 150 (CAS 154518-36-2) are products and trademarks of Zschimmer and Schwarz Company. Propetal 140 and Propetal 150 are ethoxylated/propoxylated fatty alcohols.

Simulsol DR 301 (CAS 68154-97-2) is a product and trademark of Seppic Company, Cologne, Germany. Simulsol DR 301 is hereinafter abbreviated as Simulsol 301. Simulsol 301 is an ethoxylated/propoxylated fatty alcohol wherein the fatty alcohol has 10 to 12 carbon atoms (C10-C12 alcohol).

Imbentin PPF is a product and trademark of Kolb Company, Hedingen, Switzerland. Imbentin PPF is hereinafter abbreviated as "Imbentin". Imbentin is an ethoxylated/propoxylated C8-C18 alcohol. The CAS number is 69013-18-9.

As the so-called second surfactant, alternative ii), the following surfactants were used throughout the Examples:

Mulsifan RT 203/80 is a product and trademark of Zschimmer & Schwarz Company. Mulsifan RT 203/80 is hereinafter abbreviated as Mulsifan. Mulsifan is an ethoxylated C12-C15 fatty alcohol.

Marlipal 013/90 (CAS 69011-36-5) is a product and trademark of Sasol Germany GmbH, Hamburg, Germany. Marlipal 013/90 is hereinafter abbreviated as Marlipal. Marlipal is an ethoxylated iso-tridecanol having between 5 and 20 ethyleneglycol-units.

Surfaline OX 1006 L (CAS 61827-42-7) and Surfaline OX 1309 L (CAS 9043-30-5) are products and trademarks of CECA SA, France. Surfaline OX 1006 L is hereinafter abbreviated as "Surfaline 1006". Surfaline 1006 is an ethoxylated C10 fatty alcohol having 6 ethyleneglycol-units. Surfaline OX 1309 L is hereinafter abbreviated as "Surfaline 1309". Surfaline 1309 is an ethoxylated iso-tridecanol having 9 ethyleneglycol-units.

Genapol UD 079 is a product and trademark of Clariant Corporation, North Carolina, USA. Genapol UD 079 is hereinafter abbreviated as Genapol. Genapol is an ethoxylated undecanol.

1.2 Cleaning Solutions

Cleaning solutions were produced with following components:

Sulphuric acid: 10 wt.-%
Optionally one or more carboxylic acids
Ethylene glycol monobutylether: 1000 mg/l unless otherwise stated
One or two surfactants
the balance being water Kind and concentration of surfactants and kind and concentration of carboxylic acids are indicated in the description of the specific Example if used in the Example. When concentrations are given in ppm units, this is equal to mg/l.

1.3 Determination of Cloud Point

The cloud point was determined according to European Standard EN 1890:2006, item 8.2, procedure A of the German Version, with the modification that 10 wt % $H_2SO_4$ was used as solvent and that the concentration of the surfactant was 1000 mg/L. When mixtures of surfactants were measured, concentrations of surfactants may differ from 1000 mg/L. Concentrations of surfactants used in mixtures are indicated in the description of the specific Example.

100 ml of a surfactant in solution was filled in a beaker and heated up slowly on a magnetic stirrer. After the solution became turbid the heater was switched off. Temperature of the surfactant solution was monitored while the solution slowly cooled. The cloud point was reached when the solution again became clear and the temperature of the cloud point was recorded.

1.4 Determination of Static Surface Tension

For the determination of static surface tension the Wilhelmy plate method is applied wherein a thin platinum plate having a defined size is used to measure the interfacial tension at an air-liquid interface. Therefore, the plate is dipped into a solution for a defined depth and then is subsequently pulled out of the solution while the force needed for pulling out is measured. This force is correlated to the static surface tension.

1.5 Determination of Dynamic Surface Tension

The surface tension referring to a certain surface age is called dynamic surface tension. In the case of liquids containing surface-active substances (surfactants), dynamic surface tension can differ from the surface tension at equilibrium. Immediately after a surface is produced the dynamic surface tension of a surfactant solution being in contact with this young surface has the same value as the pure liquid. When the surface ages, i.e. is in contact with the surfactant over time, the surface tension decreases due to adsorption of the surfactant at the surface until an equilibrium is reached. The time required for reaching the equilibrium depends on the diffusion rate and the adsorption rate of the surfactant. The lower the surface tension is the better the wetting and cleaning properties are. Therefore, the dynamic surface tension is a suitable measure for extent and speed of wetting and cleaning.

Dynamic surface tension was measured with a bubble pressure tensiometer. The surface tension of a surface which is in the process of forming, i.e. the surface of a gas bubble, is measured. The tensiometer produces gas bubbles within the solution of surfactant to be tested. The size and age of the interface of gas bubble and surfactant solution changes during the measurement. While producing a bubble the pressure of the bubble reaches a maximum which is recorded by the tensiometer. The time from start of bubble formation to maximum pressure is called the surface age. The surface tension is measured as a function of surface age.

Measurement was done as follows:

Bubble pressure tensiometer BP2 of Krüss company, Hamburg, Germany
Temperature 23° C.
Surfactants were solubilized in 10 wt % $H_2SO_4$ in water. Concentrations of surfactants are shown in examples, or are as indicated above.

1.6 Determination of Cleaning Performance

Cleaning performance of different cleaners was tested by applying 3 finger prints from different persons on panels of standard copper clad base material as samples. After cleaning, the panels were plated with copper.

Test Procedure:

1. Three different finger prints were applied on copper clad material.
2. The samples having the finger prints were cleaned for 3 min at 35° C. with slow solution agitation by a magnetic stirrer using the inventive and comparative cleaning solutions.
3. The samples were rinsed for 2 min with city water.
4. The samples were treated with an acid pre dip (5 wt % $H_2SO_4$) for 1 minute.
5. The samples were copper plated for 30 min at 1.5 A/dm² in an acidic copper electrodeposition bath (Cupracid TP, product of Atotech Deutschland GmbH).
6. The performance of cleaning was ranked by visual inspection.

The ranking was done by judging the fingerprints after plating on a scale from 1 to 5. "5" means best result, maximum cleaning effect with very slight remaining visible finger print, "1" means worst cleaning performance, finger prints still clearly visible. Finger prints are completely extant. No initial weakening or rinsing away of finger prints can be detected.

1.7 ICD Test

ICD tests (ICD=Interconnection Defect) are usually performed as a quality control for copper layers deposited onto polymeric material, i.e. printed circuit boards (PCBs), and the strength of the interconnections. Herein, the metallization, quality of cleaning and quality of rinsing of a metal surface were tested using the ICD test. The main step of the ICD test is the solder shock test. The solder shock step is used in order to test whether the adhesion of a copper layer electrolytically deposited onto an already present copper layer (electrolessly deposited) and onto the exposed part of an already present inner copper layer is sufficient. The contacting area of the stack of the electrolytically deposited and the electrolessly deposited copper layers with the exposed part of the inner copper layer is called an interconnection. The solder shock step is performed after the already present electroless copper layer and the exposed part of the inner copper layer were cleaned with a cleaning solution. If the cleaning was not sufficient and organic contaminations were still present on the electroless copper layer and the exposed part of the inner copper layer after cleaning, adhesion of the electrolytically deposited copper layer will be bad and the solder shock step will cause defects like delamination or voids. If the rinsing performed after cleaning was not sufficient and residues of the surfactants resulting from the cleaning solution were still present on the electroless copper layer and the exposed part of the inner copper layer, adhesion of the electrolytically deposited copper layer will also be impaired and the solder shock step will cause the same defects. If defects occured in the solder shock step, the tested cleaning solution did not pass the ICD test.

Thus, the ICD test is a measure for the quality of cleaning and wetting of the already present metal layer with the cleaning solution of the invention and rinsability of the cleaning solution. Metal layers deposited onto walls of through holes within such a substrate are particularly sensitive to solder shock tests. The solder shock test is a thermal stress test. Samples of metal layers deposited onto a polymeric substrate were floated (repeatedly) on hot solder and afterwards inspected by micro-section analysis. The mismatch between thermal expansion coefficients of polymeric substrate and metal leads to high mechanical stress, which can cause damage of the metal plated polymeric substrate. The procedure is a modified version of IPC norm: IPC-TM-650, Number 2.6.8, Revision E, Thermal Stress, Plated-Through Holes.

Typical defects are corner cracks, barrel cracks, inner layer interconnection separations, resin recession, pull away, pad rotation, pad lifting, delamination, resin cracks, and extreme deformation of the sample. If the sample does not show such defects after applying the solder shock test, cleaning and/or wetting of the metal layer already present on the substrate and rinsability of the cleaning solution were of highest quality.

Sample Preparation

Standard copper clad base material having through holes (multilayer substrate having two inner copper layers and being copper clad on both outer surfaces) was used as samples. The samples were already desmeared and electrolessly plated with a copper layer of 1 µm thickness onto the copper cladding and onto the walls of the through holes.

The samples were cleaned for 5 min at 35° C. with slow solution agitation by a magnetic stirrer using the inventive and comparative cleaning solutions. Cleaning solutions are summarized below. Afterwards, the samples were rinsed for 1 minute with city water and 5 seconds with deionized water. The samples were air-dried at room temperature (about 21° C.) for 2 hours. Subsequently, the samples were plated with copper using an acidic copper electrodepositon bath (Cupracid BL R, product of Atotech Deutschland GmbH, direct current 1.5 A/dm$^2$, 136 minutes, room temperature). The resulting copper layer had a thickness of 45 µm.

Both openings of through holes metallized by this procedure were subsequently covered with an adhesive tape to simulate an etch resist (protect the copper inside the holes during the etching process). Afterwards the parts of the copper layer on the substrate remaining uncovered by the tape were etched away using a HNO$_3$ solution (concentrated HNO$_3$ to water=1:1). Then, the tape was removed from the samples and adhesive residues resulting from the tape) were removed from the samples with an organic solvent. Finally, the samples were annealed for 6 hours at 140° C. in order to reduce stress of the electrodeposited copper layers. The samples were allowed to cool down to room temperature prior to solder shock testing.

Solder Shock Test

The electroplated samples were dipped into flux in order to remove oxide layers completely from the copper surface and excess flux was drained. The samples were floated onto a solder bath of appropriate temperature for at least 10 seconds. Afterwards, the samples were removed from the solder and allowed to cool for at least 10 minutes. The samples were shocked by the above outlined procedure as follows: Sample 1 was shocked for six times at 288° C. Sample 2 was shocked for nine times at 288° C. Sample 3 was shocked for six times at 326° C. Finally, any excess flux residues were removed by thoroughly rinsing the samples in isopropanol. Afterwards, the samples were dried by airflow.

Micro Section Preparation

The samples were cut into single stripes in such a way that the through holes were cut through in their center. The samples were embedded into epoxy resin and the resulting blocks of resin embedded samples were grinded and polished until the section passing through the center of a through-hole was clearly visible. The samples were inspected by optical microscopy for detecting defects as mentioned above. Some samples were inspected by scanning electron microscopy (SEM) additionally.

2. Examples 2.1 Cloud Point and Static Surface Tension

Solutions of surfactants were prepared and their cloud point and static surface tension were measured as described in sections 1.3 and 1.4. If not otherwise stated, the concentration of the respective surfactant was 1000 ppm surfactant in 10 wt.-% H$_2$SO$_4$ within the prepared solution. The results are summarized in Table 1.

TABLE 1

Cloud points and static surface tension of surfactant solutions

| Surfactant | Cloud Point/° C. | Static Surface Tension/mN/m |
|---|---|---|
| Propetal 120 | <23 | 30.5 |
| Propetal 105 | <23 | 26.7 |
| Propetal 140 | 37 | 30.4 |
| Propetal 150 | 52 | 29.9 |
| Simulsol 301 | 60 | 31.0 |
| Imbentin | 35.5 | 31.6 |
| Mulsifan | >70 | 32.6 |
| Marlipal | 68 | 27.6 |
| Surfaline 1006 | 48 | 26.8 |
| Surfaline 1309 | 60 | 27.6 |
| Antarox | <23 | 31.9 |
| Genapol UD 079 | 63 | 27.2 |
| Marlox | <23 | 30.3 |
| Propetal 120/Simulsol 301 500/500 ppm | 31.5 | 30.2 |
| Propetal 120/Marlipal 500/500 ppm | 31.0 | 28.6 |
| Propetal 120/Mulsifan 500/500 ppm | 44.0 | 30.4 |

The cloud point of Propetal 120 was increased when mixed with Simulsol 301, Marlipal or Mulsifan. Static surface tension of the mixtures is in a similar range compared to performance of the single surfactants.

2.2 Dynamic Surface Tension

A synergistic effect was quantified in surfactant mixtures with respect to dynamic surface tension.

For quantifying the synergistic effect it was assumed that surface tension of a surfactant mixture at a distinct age of the surface (dynamic measurement) is proportional to the surface tension of the single surfactants. The surface age chosen was 100 milliseconds, since e.g. in application for cleaning of blind micro vias (vertical interconnect access), a fast wetting of the surface is essential.

It was assumed that the surfactants used are called A and B, wherein B has a lower surface tension at a given surface age. When used as a single surfactant in solution the concentrations are $c_A=c_{total}$ and $c_B=c_{total}$. The surface tensions of the single surfactants are $\sigma_A$ and $\sigma_B$.

The difference of the surface tensions is: $\Delta_{A,B}=\sigma_A-\sigma_B$. When a mixture of surfactants A and B is used in solution the concentration of surfactants sums up to $c_A+c_B=c_{total}$. Then, the theoretical surface tension $\sigma_{theor}$ for $c_A+c_B=c_{total}$ in a mixture of A and B is:

$$\sigma_{theor} = \sigma_B + \Delta_{A,B} * \frac{c_A}{c_{total}}$$

For calculation of a synergistic effect, the difference between the really obtained value $\sigma_{A,B}$ of surface tension in the mixture and the expected theoretical value of surface tension in the mixture is set in relation to the difference of surface tensions of the single surfactants:

$$\text{synergy}[\%] = \frac{\sigma_{theor} - \sigma_{A,B}}{\Delta_{A,B}} * 100$$

If the result is positive, the mixture has a lower surface tension as expected, and a higher wetting and cleaning speed. The lower the surface tension, the better the wetting and cleaning properties are. If the result is negative, the mixture has a higher surface tension as expected.

Dynamic surface tension was measured as described in section 1.5. When a single surfactant was used in solution, the concentration $c_A$ or $c_B$ of the single surfactant A or B was 1000 ppm for each surfactant used in dynamic surface tension measurement unless stated otherwise. When a mixture of surfactants A and B was used in solution, the concentration $c_A$ or $c_B$ of the individual surfactant A or B was 500 ppm each summing up to a total surfactant concentration $c_{total}$ of 1000 ppm unless stated otherwise.

2.2.1 Dynamic Surface Tension of Propetal 120 and Propetal 150

FIG. 1 shows the dynamic surface tension (a) of a mixture of Propetal 120 (surfactant A) and Propetal 150 (surfactant B) in comparison to the individual surfactants, data are summarized in Table 2 ("surface age" in FIG. 1 corresponds to "bubble age" in Table 2). The calculation according to the above formulas with the surface tension values at 100 ms lead to the results summarized in Table 3.

TABLE 2

Dynamic surface tension σ of Propetal 120 and Propetal 150

| Propetal 120 | | Propetal 150 | | Propetal 120 and 150 | |
| --- | --- | --- | --- | --- | --- |
| bubble age/ms | σ/mN/m | bubble age/ms | σ/mN/m | bubble age/ms | σ/mN/m |
| 10.3 | 48.95 | 10.1 | 48.22 | 9.9 | 46.96 |
| 16.3 | 45.83 | 15.7 | 46.06 | 10 | 47.19 |
| 24.8 | 44.35 | 25.4 | 44.48 | 15.9 | 45.56 |
| 40.1 | 45.34 | 39.4 | 42.98 | 24.9 | 43.49 |
| 66.5 | 42.35 | 62.4 | 41.27 | 39.3 | 41.95 |
| 101.6 | 41.32 | 98.7 | 39.33 | 62.2 | 39.69 |
| 153.5 | 40.28 | 153.5 | 37.7 | 98.8 | 37.7 |
| 239.3 | 35.72 | 239 | 36.35 | 151.7 | 35.85 |
| 378.8 | 35.4 | 383.9 | 34.99 | 238.8 | 34.27 |
| 605 | 34.41 | 603.5 | 33.68 | 378.2 | 33.05 |
| 962.4 | 33.68 | 979.4 | 32.82 | 601.1 | 32.11 |
| 1497.7 | 33.36 | 1466.4 | 32.33 | 953.5 | 31.51 |
| 2282.7 | 32.51 | 2273 | 31.74 | 1485.7 | 31.11 |
| 3623.7 | 31.7 | 3598.9 | 31.29 | 2267.4 | 30.88 |
| 5718.5 | 31.38 | 5725.4 | 30.93 | 3611.7 | 30.61 |
| 9241.7 | 31.06 | 9055.6 | 30.8 | 5733.4 | 30.43 |
| 14375.6 | 30.8 | 14634.8 | 30.61 | 9072 | 30.39 |

TABLE 2-continued

Dynamic surface tension σ of Propetal 120 and Propetal 150

| Propetal 120 | | Propetal 150 | | Propetal 120 and 150 | |
| --- | --- | --- | --- | --- | --- |
| bubble age/ms | σ/mN/m | bubble age/ms | σ/mN/m | bubble age/ms | σ/mN/m |
| 20349.4 | 30.66 | 20066.4 | 30.52 | 14451.4 | 30.25 |
| | | | | 21282.5 | 30.12 |

TABLE 3

Mixture Propetal 120/Propetal 150

| | |
| --- | --- |
| $\sigma_A$ (surface tension of single surfactant A) | 41 mN/m |
| $\sigma_B$ (surface tension of single surfactant B) | 39.5 mN/m |
| $\sigma_{A,B}$ (measured surface tension of a mixture of surfactants A and B) | 37.8 mN/m |
| $\sigma_{theor}$ (calculated surface tension of a mixture of surfactants A and B) | 40.25 mN/m |
| synergy | 163% |

2.2.2 Dynamic Surface Tension of Propetal 120 and Marlipal

Data of dynamic surface tension of a mixture of Marlipal (surfactant A) and Propetal 120 (surfactant B) in comparison to the individual surfactants are summarized in Table 4. The calculation according to the above formulas with the surface tension values at 100 ms lead to the results summarized in Table 5.

TABLE 4

Dynamic surface tension σ of Marlipal and Propetal 120

| Marlipal | | Propetal 120 | | Marlipal and Propetal 120 | |
| --- | --- | --- | --- | --- | --- |
| bubble age/ms | σ/mN/m | bubble age/ms | σ/mN/m | bubble age/ms | σ/mN/m |
| 10.3 | 54.48 | 10.3 | 48.95 | 9.9 | 51 |
| 16.6 | 52.76 | 16.3 | 45.83 | 10 | 51.67 |
| 24.9 | 51.04 | 24.8 | 44.35 | 16.3 | 49.05 |
| 39.2 | 49.01 | 40.1 | 45.34 | 24.9 | 47.56 |
| 62.3 | 46.03 | 66.5 | 42.35 | 39.2 | 45.17 |
| 98.9 | 43.05 | 101.6 | 41.32 | 62.3 | 42.64 |
| 151.2 | 40.16 | 153.5 | 40.28 | 98.9 | 39.07 |
| 239.4 | 37.76 | 239.3 | 35.72 | 155.7 | 37.17 |
| 383.3 | 35.64 | 378.8 | 35.4 | 238.9 | 35.28 |
| 602.1 | 33.7 | 605 | 34.41 | 381.2 | 33.25 |
| 970.2 | 32.16 | 962.4 | 33.68 | 600.6 | 32.11 |
| 1482.6 | 31.17 | 1497.7 | 33.36 | 973.2 | 31.26 |
| 2266.7 | 30.4 | 2282.7 | 32.51 | 1477.4 | 30.71 |
| 3628.3 | 29.81 | 3623.7 | 31.7 | 2262.6 | 30.35 |
| 5691 | 29.36 | 5718.5 | 31.38 | 3590.8 | 29.86 |
| 9161.3 | 28.59 | 9241.7 | 31.06 | 5732.2 | 29.63 |
| 14466.5 | 28.46 | 14375.6 | 30.8 | 9089.3 | 29.59 |
| 20465.7 | 28.41 | 20349.4 | 30.66 | 14576.9 | 29.49 |
| | | | | 20873.8 | 29.45 |

TABLE 5

Mixture Marlipal/Propetal 120

| | |
| --- | --- |
| $\sigma_A$ (surface tension of single surfactant A) | 43 mN/m |
| $\sigma_B$ (surface tension of single surfactant B) | 41 mN/m |
| $\sigma_{A,B}$ (measured surface tension of a mixture of surfactants A and B) | 39.5 mN/m |
| $\sigma_{theor}$ (calculated surface tension of a mixture of surfactants A and B) | 42.0 mN/m |
| synergy | 125% |

2.2.3 Dynamic Surface Tension of Propetal 120 and Simulsol 301

Data of dynamic surface tension of a mixture of Simulsol 301 (surfactant A) and Propetal 120 (surfactant B) in comparison to the individual surfactants are summarized in Table 6. The calculation according to the above formulas with the surface tension values at 100 ms lead to the results summarized in Table 7.

TABLE 6

Dynamic surface tension σ of Simulsol 301 and Propetal 120

| Simulsol 301 | | Propetal 120 | | Simulsol 301 + Propetal 120 | |
|---|---|---|---|---|---|
| bubble age/ms | σ/mN/m | bubble age/ms | σ/mN/m | bubble age/ms | σ/mN/m |
| 10.1 | 54.25 | 10.3 | 48.95 | 9.9 | 50.1 |
| 15.8 | 52.4 | 16.3 | 45.83 | 10.3 | 49.82 |
| 24.9 | 50.46 | 24.8 | 44.35 | 16 | 48.47 |
| 39.3 | 48.24 | 40.1 | 45.34 | 24.8 | 46.48 |
| 62.4 | 45.98 | 66.5 | 42.35 | 39.3 | 44.31 |
| 98.7 | 43.41 | 101.6 | 41.32 | 62.5 | 42.14 |
| 153.6 | 41.51 | 153.5 | 40.28 | 98.5 | 39.39 |
| 239.6 | 39.71 | 239.3 | 35.72 | 155.2 | 37.45 |
| 378.5 | 38.03 | 378.8 | 35.4 | 238.8 | 35.95 |
| 599.8 | 36.81 | 605 | 34.41 | 381 | 34.28 |
| 968.5 | 35.64 | 962.4 | 33.68 | 605.2 | 33.25 |
| 1486.6 | 34.64 | 1497.7 | 33.36 | 953.4 | 32.39 |
| 2264.5 | 33.88 | 2282.7 | 32.51 | 1491.6 | 31.85 |
| 3585.8 | 33.29 | 3623.7 | 31.7 | 2265.6 | 31.44 |
| 5765.4 | 32.84 | 5718.5 | 31.38 | 3587.7 | 31.17 |
| 9133.3 | 32.48 | 9241.7 | 31.06 | 5765.2 | 30.94 |
| 14400.7 | 32.21 | 14375.6 | 30.8 | 9147.4 | 30.76 |
| 20288 | 32.02 | 20349.4 | 30.66 | 14405.5 | 30.67 |
| | | | | 21025.7 | 30.54 |

TABLE 7

Mixture Simulsol 301/Propetal 120

| | |
|---|---|
| $\sigma_A$ (surface tension of single surfactant A) | 43 mN/m |
| $\sigma_B$ (surface tension of single surfactant B) | 41 mN/m |
| $\sigma_{A,B}$ (measured surface tension of a mixture of surfactants A and B) | 39.5 mN/m |
| $\sigma_{theor}$ (calculated surface tension of a mixture of surfactants A and B) | 42.0 mN/m |
| synergy | 125% |

2.2.4 Dynamic Surface Tension of Propetal 120 and Mulsifan

Data of dynamic surface tension of a mixture of Mulsifan (surfactant A) and Propetal 120 (surfactant B) in comparison to the individual surfactants are summarized in Table 8. The calculation according to the above formulas with the surface tension values at 100 ms lead to the results summarized in Table 9.

TABLE 8

Dynamic surface tension σ of Mulsifan and Propetal 120

| Mulsifan | | Propetal 120 | | Mulsifan and Propetal 120 | |
|---|---|---|---|---|---|
| bubble age/ms | σ/mN/m | bubble age/ms | σ/mN/m | bubble age/ms | σ/mN/m |
| 10 | 63.64 | 10.3 | 48.95 | 9.9 | 52.12 |
| 10 | 63.28 | 16.3 | 45.83 | 9.9 | 52.12 |
| 15.7 | 62.38 | 24.8 | 44.35 | 16.1 | 50.5 |
| 24.8 | 61.34 | 40.1 | 45.34 | 24.8 | 49.01 |
| 39.2 | 59.89 | 66.5 | 42.35 | 39.3 | 46.48 |
| 62.2 | 57.68 | 101.6 | 41.32 | 62.3 | 44.09 |
| 98.5 | 54.93 | 153.5 | 40.28 | 98.6 | 41.87 |
| 151.3 | 52.08 | 239.3 | 35.72 | 152 | 39.39 |
| 240 | 49.46 | 378.8 | 35.4 | 243.2 | 37.49 |
| 385.2 | 47.02 | 605 | 34.41 | 379.3 | 36 |
| 600.8 | 45.08 | 962.4 | 33.68 | 600.5 | 34.6 |
| 953.5 | 43.23 | 1497.7 | 33.36 | 977.2 | 33.38 |
| 1481 | 41.69 | 2282.7 | 32.51 | 1474.1 | 32.71 |
| 2266.8 | 40.33 | 3623.7 | 31.7 | 2262.8 | 32.07 |
| 3617 | 39.02 | 5718.5 | 31.38 | 3606.5 | 31.57 |
| 5727.7 | 37.86 | 9241.7 | 31.06 | 5708.2 | 31.21 |
| 9103.6 | 36.77 | 14375.6 | 30.8 | 9185.1 | 30.86 |
| 14661.9 | 35.82 | 20349.4 | 30.66 | 14275.3 | 30.63 |
| 20561.4 | 35.19 | | | 20535.8 | 30.54 |

TABLE 9

Mixture Mulsifan/Propetal 120

| | |
|---|---|
| $\sigma_A$ (surface tension of single surfactant A) | 55 mN/m |
| $\sigma_B$ (surface tension of single surfactant B) | 41 mN/m |
| $\sigma_{A,B}$ (measured surface tension of a mixture of surfactants A and B) | 41.5 mN/m |
| $\sigma_{theor}$ (calculated surface tension of a mixture of surfactants A and B) | 48.0 mN/m |
| synergy | 46% |

2.2.5 Dynamic Surface Tension of Propetal 120 and Propetal 140

Figure 2:
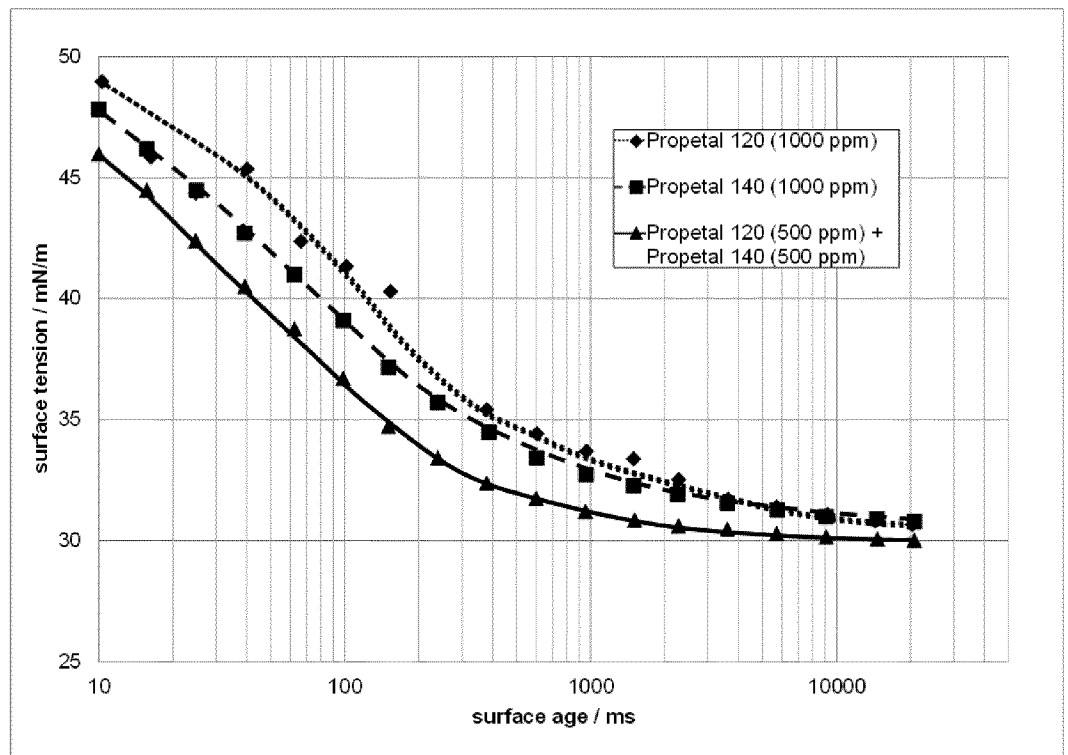

FIG. 2 shows dynamic surface tension (a) of a mixture of Propetal 120 (surfactant A) and Propetal 140 (surfactant B) in comparison to the individual surfactants. The dynamic surface tension data are summarized in Table 10 ("surface age" in FIG. 2 corresponds to "bubble age" in Table 10). The calculation according to the above formulas with the surface tension values at 100 ms lead to the results summarized in Table 11.

TABLE 10

Dynamic surface tension σ of Propetal 120 and Propetal 140

| Propetal 120 | | Propetal 140 | | Propetal 120 and 140 | |
|---|---|---|---|---|---|
| bubble age/ms | σ/mN/m | bubble age/ms | σ/mN/m | bubble age/ms | σ/mN/m |
| 10.3 | 48.95 | 10 | 47.81 | 9.9 | 46.05 |
| 16.3 | 45.83 | 15.7 | 46.18 | 10 | 45.96 |
| 24.8 | 44.35 | 25 | 44.46 | 15.7 | 44.46 |
| 40.1 | 45.34 | 39.2 | 42.7 | 24.8 | 42.38 |
| 66.5 | 42.35 | 62.6 | 40.99 | 39.3 | 40.49 |
| 101.6 | 41.32 | 98.7 | 39.09 | 62.5 | 38.73 |
| 153.5 | 40.28 | 150.8 | 37.15 | 98.5 | 36.69 |
| 239.3 | 35.72 | 238.7 | 35.7 | 150.7 | 34.71 |
| 378.8 | 35.4 | 386.5 | 34.48 | 239.3 | 33.4 |
| 605 | 34.41 | 603.5 | 33.4 | 378.2 | 32.36 |
| 962.4 | 33.68 | 960 | 32.72 | 600.7 | 31.73 |
| 1497.7 | 33.36 | 1501.9 | 32.27 | 954 | 31.19 |
| 2282.7 | 32.51 | 2266.2 | 31.91 | 1510.4 | 30.83 |
| 3623.7 | 31.7 | 3598.4 | 31.55 | 2280.6 | 30.6 |
| 5718.5 | 31.38 | 5755.1 | 31.28 | 3603.8 | 30.46 |
| 9241.7 | 31.06 | 9091.6 | 31 | 5713.5 | 30.29 |
| 14375.6 | 30.8 | 14632.3 | 30.91 | 9097.4 | 30.14 |
| 20349.4 | 30.66 | 20737.2 | 30.78 | 14710 | 30.06 |
| | | | | 20751 | 30.01 |

TABLE 11

| Mixture Propetal 120/Propetal 140 | |
| --- | --- |
| $\sigma_A$ (surface tension of single surfactant A) | 41 mN/m |
| $\sigma_B$ (surface tension of single surfactant B) | 39 mN/m |
| $\sigma_{A, B}$ (measured surface tension of a mixture of surfactants A and B) | 36.5 mN/m |
| $\sigma_{theor}$ (calculated surface tension of a mixture of surfactants A and B) | 40.0 mN/m |
| synergy | 175% |

The above results of Examples 2.2.1 to 2.2.5 showed a synergistic effect in surfactant mixtures as used in cleaning solutions of the present invention. The surfactant mixtures of the present invention have a lower dynamic surface tension and a higher wetting speed than the single surfactants.

2.2.6 Dynamic Surface Tension of Propetal 105 and Simulsol 301

Data of dynamic surface tension of a mixture of Propetal 105 (surfactant B) and Simulsol 301 (surfactant A) in comparison to the individual surfactants are summarized in Table 12. Concentration of Propetal 105 in the mixture was 500 ppm and concentration of Simulsol 301 in the mixture was 1500 ppm. The surfactant solutions containing only a single surfactant had a surfactant concentration of 2000 ppm each. The calculation according to the above formulas with the surface tension values at 100 ms lead to the results summarized in Table 13.

TABLE 12

Dynamic surface tension σ of Propetal 105 and Simulsol 301

| Propetal 105 | | Simulsol 301 | | Propetal 105 and Simulsol 301 | |
| --- | --- | --- | --- | --- | --- |
| bubble age/ms | σ/mN/m | bubble age/ms | σ/mN/m | bubble age/ms | σ/mN/m |
| 9.9 | 49.8 | 10.4 | 50.98 | 10.2 | 50.2 |
| 10 | 50.9 | 15.7 | 47.35 | 15.7 | 48.2 |
| 15.8 | 45.5 | 24.8 | 43.72 | 24.8 | 44.1 |
| 25 | 42.8 | 39.2 | 40.67 | 39.3 | 40.0 |
| 41 | 38.6 | 62.2 | 38.28 | 62.3 | 36.7 |
| 62.3 | 37.2 | 98.5 | 36.72 | 98.7 | 34.4 |
| 101.5 | 34.1 | 153.1 | 35.91 | 155.7 | 32.9 |
| 154.2 | 32.1 | 245.2 | 35.01 | 243.1 | 31.8 |
| 243.9 | 32.8 | 378.6 | 34.12 | 382.8 | 30.8 |
| 380 | 30.4 | 602.3 | 33.44 | 607.9 | 30.0 |
| 619.4 | 29.5 | 986.5 | 32.95 | 972.0 | 29.3 |
| 969.8 | 27.9 | 1529.1 | 32.37 | 1482.4 | 28.8 |
| 1510.3 | 27.7 | 2264.7 | 32.23 | 2268.1 | 28.5 |
| 2275.3 | 27.7 | 3598 | 31.78 | 3609.5 | 28.2 |
| 3598.9 | 27.1 | 5703.3 | 31.56 | 5709.8 | 27.9 |
| 5690.9 | 27.0 | 9029.9 | 31.33 | 9084.7 | 27.7 |
| 9113 | 26.9 | 14493.1 | 31.24 | 14513.5 | 27.6 |
| 14488.9 | 26.6 | 22776.4 | 31.01 | 22959.4 | 27.4 |
| 23038.7 | 26.6 | 25176 | 30.97 | 25180.6 | 27.4 |

TABLE 13

| Mixture Propetal 105/Simulsol 301 | |
| --- | --- |
| $\sigma_A$ (surface tension of single surfactant A) | 37.3 mN/m |
| $\sigma_B$ (surface tension of single surfactant B) | 30.8 mN/m |
| $\sigma_{A, B}$ (measured surface tension of a mixture of surfactants A and B) | 34.3 mN/m |
| $\sigma_{theor}$ (calculated surface tension of a mixture of surfactants A and B) | 35.7 mN/m |
| synergy | 21.3% |

2.2.7 Dynamic Surface Tension of Propetal 105 and Propetal 150

Data of dynamic surface tension of a mixture of Propetal 105 (surfactant B) and Propetal 150 (surfactant A) in comparison to the individual surfactants are summarized in Table 14. The calculation according to the above formulas with the surface tension values at 100 ms lead to the results summarized in Table 15.

TABLE 14

Dynamic surface tension σ of Propetal 105 and Propetal 150

| Propetal 105 | | Propetal 150 | | Propetal 105 and 150 | |
| --- | --- | --- | --- | --- | --- |
| bubble age/ms | σ/mN/m | bubble age/ms | σ/mN/m | bubble age/ms | σ/mN/m |
| 9.9 | 49.8 | 10.4 | 50.98 | 10.2 | 50.2 |
| 10 | 50.9 | 15.7 | 47.35 | 15.7 | 48.2 |
| 15.8 | 45.5 | 24.8 | 43.72 | 24.8 | 44.1 |
| 25 | 42.8 | 39.2 | 40.67 | 39.3 | 40.0 |
| 41 | 38.6 | 62.2 | 38.28 | 62.3 | 36.7 |
| 62.3 | 37.2 | 98.5 | 36.72 | 98.7 | 34.4 |
| 101.5 | 34.1 | 153.1 | 35.91 | 155.7 | 32.9 |
| 154.2 | 32.1 | 245.2 | 35.01 | 243.1 | 31.8 |
| 243.9 | 32.8 | 378.6 | 34.12 | 382.8 | 30.8 |
| 380 | 30.4 | 602.3 | 33.44 | 607.9 | 30.0 |
| 619.4 | 29.5 | 986.5 | 32.95 | 972.0 | 29.3 |
| 969.8 | 27.9 | 1529.1 | 32.37 | 1482.4 | 28.8 |
| 1510.3 | 27.7 | 2264.7 | 32.23 | 2268.1 | 28.5 |
| 2275.3 | 27.7 | 3598 | 31.78 | 3609.5 | 28.2 |
| 3598.9 | 27.1 | 5703.3 | 31.56 | 5709.8 | 27.9 |
| 5690.9 | 27.0 | 9029.9 | 31.33 | 9084.7 | 27.7 |
| 9113 | 26.9 | 14493.1 | 31.24 | 14513.5 | 27.6 |
| 14488.9 | 26.6 | 22776.4 | 31.01 | 22959.4 | 27.4 |
| 23038.7 | 26.6 | 25176 | 30.97 | 25180.6 | 27.4 |

TABLE 15

| Mixture Propetal 105/Propetal 150 | |
| --- | --- |
| $\sigma_A$ (surface tension of single surfactant A) | 36.7 mN/m |
| $\sigma_B$ (surface tension of single surfactant B) | 34.4 mN/m |
| $\sigma_{A, B}$ (measured surface tension of a mixture of surfactants A and B) | 34.4 mN/m |
| $\sigma_{theor}$ (calculated surface tension of a mixture of surfactants A and B) | 35.5 mN/m |
| synergy | 51.3% |

2.2.8 Dynamic surface tension of Propetal 105 and Marlipal

Data of dynamic surface tension of a mixture of Propetal 105 (surfactant B) and Marlipal (surfactant A) in comparison to the individual surfactants are summarized in Table 16. The calculation according to the above formulas with the surface tension values at 100 ms lead to the results summarized in Table 17.

TABLE 16

Dynamic surface tension σ of Propetal 105 and Marlipal

| Propetal 105 | | Marlipal | | Propetal 105 and Marlipal | |
| --- | --- | --- | --- | --- | --- |
| bubble age/ms | σ/mN/m | bubble age/ms | σ/mN/m | bubble age/ms | σ/mN/m |
| 9.9 | 49.8 | 10.4 | 58.3 | 10.3 | 54.7 |
| 10 | 50.9 | 15.6 | 56.1 | 15.6 | 51.3 |
| 15.8 | 45.5 | 24.8 | 52.1 | 24.8 | 47.2 |
| 25 | 42.8 | 39.3 | 48.2 | 39.4 | 42.8 |
| 41 | 38.6 | 62.2 | 43.8 | 62.3 | 39.2 |
| 62.3 | 37.2 | 98.9 | 40.4 | 98.7 | 36.7 |
| 101.5 | 34.1 | 157.1 | 38.1 | 153.4 | 34.8 |

TABLE 16-continued

Dynamic surface tension σ of Propetal 105 and Marlipal

| Propetal 105 | | Marlipal | | Propetal 105 and Marlipal | |
|---|---|---|---|---|---|
| bubble age/ms | σ/mN/m | bubble age/ms | σ/mN/m | bubble age/ms | σ/mN/m |
| 154.2 | 32.1 | 239.3 | 36.2 | 243.5 | 33.2 |
| 243.9 | 32.8 | 388.3 | 34.6 | 383.9 | 31.8 |
| 380 | 30.4 | 601.7 | 33.2 | 602.8 | 30.8 |
| 619.4 | 29.5 | 982.2 | 32.0 | 963.2 | 30.0 |
| 969.8 | 27.9 | 1479.6 | 31.1 | 1478.8 | 29.4 |
| 1510.3 | 27.7 | 2271.9 | 30.4 | 2269.5 | 28.9 |
| 2275.3 | 27.7 | 3590.7 | 29.8 | 3593.4 | 28.4 |
| 3598.9 | 27.1 | 5699.1 | 29.2 | 5729.1 | 27.8 |
| 5690.9 | 27.0 | 9045.4 | 28.8 | 9027.7 | 27.6 |
| 9113 | 26.9 | 14523.5 | 28.1 | 14554.3 | 27.5 |
| 14488.9 | 26.6 | 23268 | 27.9 | 23622.7 | 27.3 |
| 23038.7 | 26.6 | 25667.3 | 27.9 | 26226.8 | 27.2 |

TABLE 17

Mixture Propetal 105/Marlipal

| | |
|---|---|
| $\sigma_A$ (surface tension of single surfactant A) | 40.4 mN/m |
| $\sigma_B$ (surface tension of single surfactant B) | 34.4 mN/m |
| $\sigma_{A,B}$ (measured surface tension of a mixture of surfactants A and B) | 36.8 mN/m |
| $\sigma_{theor}$ (calculated surface tension of a mixture of surfactants A and B) | 37.4 mN/m |
| synergy | 10.6% |

The above results of Examples 2.2.6 to 2.2.8 showed a synergistic effect in surfactant mixtures as used in cleaning solutions of the present invention. The surfactant mixtures used in cleaning solutions of the present invention have a lower dynamic surface tension and a higher wetting speed than the single surfactants.

Following examples are comparative examples and show lack of synergism, in these cases a negative value for synergy.

2.2.9 Dynamic Surface Tension of Surfaline 1309 and Surfaline 1006

Table 18 shows dynamic surface tension of a mixture of Surfaline 1309 (surfactant A) and Surfaline OX 1006 L (surfactant B). The calculation according to the above formulas with the surface tension values at 100 ms lead to the results summarized in Table 19.

TABLE 18

Dynamic surface tension σ of a mixture of Surfaline 1309 and Surfaline 1006

| Surfaline 1309 | | Surfaline 1006 | | Surfaline 1309 and 1006 | |
|---|---|---|---|---|---|
| bubble age/ms | σ/mN/m | bubble age/ms | σ/mN/m | bubble age/ms | σ/mN/m |
| 19.7 | 51.96 | 19.9 | 44.52 | 19.8 | 51.3 |
| 24.8 | 50.25 | 24.9 | 42.99 | 24.9 | 49.78 |
| 39.3 | 47.4 | 39.3 | 40.69 | 39.3 | 47.06 |
| 62.3 | 44.53 | 62.1 | 38.71 | 62.3 | 44.57 |
| 98.7 | 41.68 | 98.8 | 36.82 | 98.6 | 42.27 |
| 150.8 | 39.42 | 150.9 | 35.16 | 150.7 | 40.1 |
| 239.2 | 37.21 | 243.4 | 33.46 | 241.3 | 37.94 |
| 378.3 | 35.23 | 378.4 | 31.8 | 379.5 | 36.05 |
| 599.8 | 33.56 | 600 | 30.51 | 609.4 | 34.34 |
| 968 | 32.23 | 972.2 | 29.4 | 954.8 | 32.78 |
| 1472.8 | 31.04 | 1468.2 | 28.53 | 1474.8 | 31.34 |
| 2262.4 | 30.25 | 2261.9 | 27.7 | 2262.3 | 30.29 |
| 3590.6 | 29.61 | 3600.2 | 27.33 | 3601.8 | 29.37 |
| 5737.2 | 28.91 | 5720.5 | 27.42 | 5742.7 | 28.67 |
| 9182.9 | 28.36 | 9063.2 | 27.24 | 9011.3 | 27.98 |
| 14757.4 | 28.04 | 14399.9 | 26.82 | 14492.4 | 27.75 |
| 23635.9 | 27.71 | 22858.4 | 26.73 | 23004.9 | 27.57 |
| 37721.4 | 27.67 | 38977.7 | 26.59 | 36424.1 | 27.39 |
| 56091.8 | 27.71 | 49513 | 26.59 | 50342.3 | 27.29 |

TABLE 19

Mixture Surfaline 1309 (surfactant A)/Surfaline 1006 (surfactant B)

| | |
|---|---|
| $\sigma_A$ (surface tension of single surfactant A) | 41.7 mN/m |
| $\sigma_B$ (surface tension of single surfactant B) | 36.8 mN/m |
| $\sigma_{A,B}$ (measured surface tension of a mixture of surfactants A and B) | 42.3 mN/m |
| $\sigma_{theor}$ (calculated surface tension of a mixture of surfactants A and B) | 39.3 mN/m |
| synergy | −62% |

2.2.10 Dynamic Surface Tension of Surfaline 1309 and Simulsol 301

Figures 3, 4:
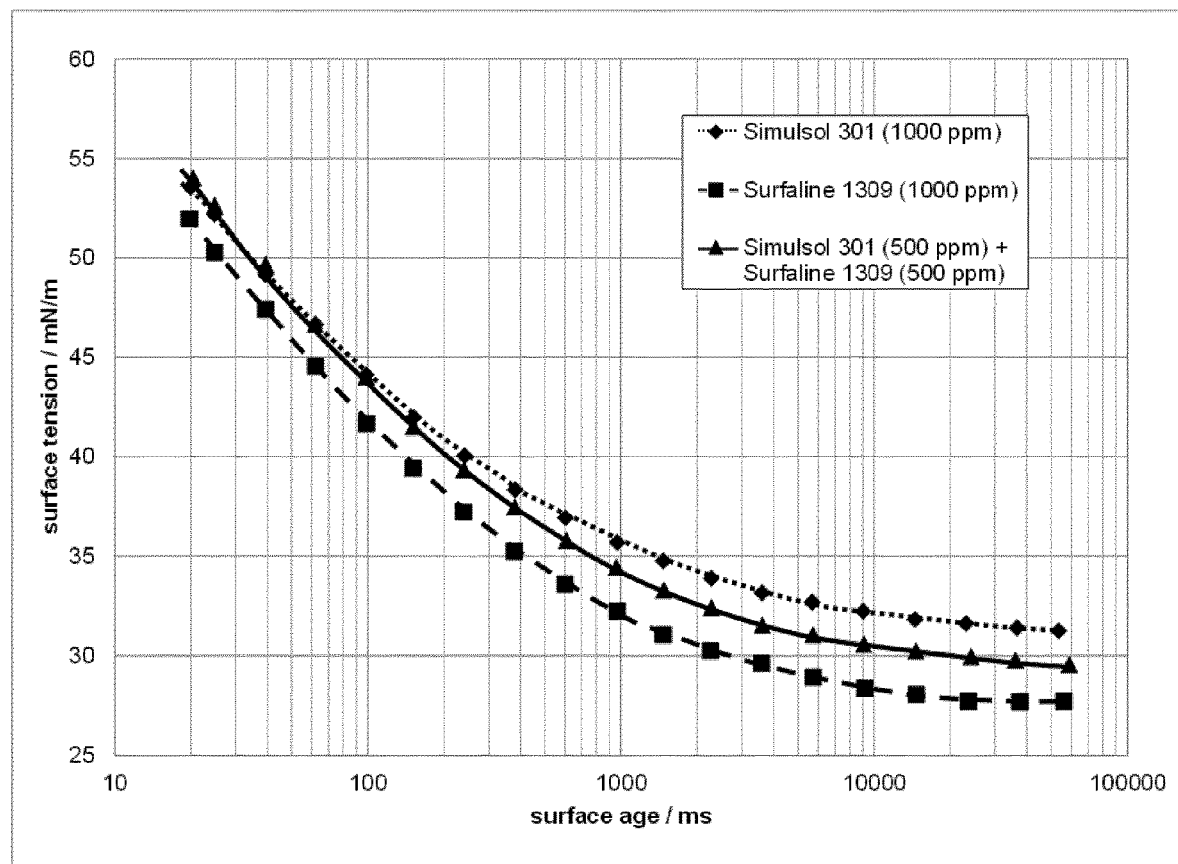

FIG. 3 shows dynamic surface tension (a) of a mixture of Simulsol 301 (surfactant A) and Surfaline 1309 (surfactant B). The dynamic surface tension data are shown in Table 20 ("surface age" in FIG. 3 corresponds to "bubble age" in Table 20). The calculation according to the above formulas with the surface tension values at 100 ms lead to the results summarized in Table 21.

TABLE 20

Dynamic surface tension σ of a mixture of Simulsol 301 and Surfaline 1309

| Simulsol 301 | | Surfaline 1309 | | Simulsol 301 and Surfaline 1309 | |
|---|---|---|---|---|---|
| bubble age/ms | σ/mN/m | bubble age/ms | σ/mN/m | bubble age/ms | σ/mN/m |
| 19.9 | 53.56 | 19.7 | 51.96 | 20.4 | 54.02 |
| 24.8 | 52.18 | 24.8 | 50.25 | 24.8 | 52.64 |
| 39.3 | 49.13 | 39.3 | 47.4 | 39.3 | 49.65 |
| 62.2 | 46.65 | 62.3 | 44.53 | 62.1 | 46.65 |
| 98.5 | 44.11 | 98.7 | 41.68 | 98.6 | 44.02 |
| 151.6 | 41.99 | 150.8 | 39.42 | 151.4 | 41.53 |
| 241.1 | 40.06 | 239.2 | 37.21 | 239.3 | 39.36 |
| 381.1 | 38.35 | 378.3 | 35.23 | 378.9 | 37.48 |
| 601.4 | 36.92 | 599.8 | 33.56 | 608.6 | 35.77 |
| 968.6 | 35.68 | 968 | 32.23 | 960.9 | 34.43 |
| 1472.7 | 34.76 | 1472.8 | 31.04 | 1477.2 | 33.29 |
| 2278 | 33.88 | 2262.4 | 30.25 | 2277.4 | 32.41 |
| 3606.2 | 33.15 | 3590.6 | 29.61 | 3614.9 | 31.53 |
| 5696.2 | 32.68 | 5737.2 | 28.91 | 5740.1 | 31.03 |
| 9029.9 | 32.22 | 9182.9 | 28.36 | 9089 | 30.57 |
| 14561.9 | 31.81 | 14757.4 | 28.04 | 14653.9 | 30.24 |
| 23110.1 | 31.62 | 23635.9 | 27.71 | 24169 | 29.96 |
| 36710.3 | 31.4 | 37721.4 | 27.67 | 36175.6 | 29.78 |
| 53673.1 | 31.25 | 56091.8 | 27.71 | 59010.3 | 29.55 |

TABLE 21

Mixture Simulsol 301 (surfactant A)/Surfaline 1309 (surfactant B)

| | |
|---|---|
| $\sigma_A$ (surface tension of single surfactant A) | 44.1 mN/m |
| $\sigma_B$ (surface tension of single surfactant B) | 41.7 mN/m |
| $\sigma_{A,B}$ (measured surface tension of a mixture of surfactants A and B) | 44.0 mN/m |
| $\sigma_{theor}$ (calculated surface tension of a mixture of surfactants A and B) | 42.9 mN/m |
| synergy | −46% |

2.2.11 Dynamic Surface Tension of Simulsol 301 and Imbentin

Table 22 shows dynamic surface tension of a mixture of Simulsol 301 (surfactant A) and Imbentin (surfactant B). The calculation according to the above formulas with the surface tension values at 100 ms lead to the results summarized in Table 23.

TABLE 22

Dynamic surface tension σ of a mixture of Simulsol 301 and Imbentin

| Simulsol 301 | | Imbentin | | Simulsol 301 and Imbentin | |
|---|---|---|---|---|---|
| bubble age/ms | σ/mN/m | bubble age/ms | σ/mN/m | bubble age/ms | σ/mN/m |
| 10 | 56.5 | 9.9 | 50.98 | 10.3 | 53.66 |
| 15.6 | 53 | 15.6 | 47.57 | 15.6 | 50.21 |
| 24.8 | 49.4 | 24.9 | 43.71 | 24.8 | 46.61 |
| 39.2 | 45.28 | 39.4 | 40.66 | 39.3 | 43.3 |
| 62.4 | 42.1 | 62.2 | 38.64 | 62.4 | 40.78 |
| 98.6 | 39.94 | 98.7 | 37.29 | 98.9 | 39.3 |
| 154.9 | 38.46 | 152.1 | 36.44 | 153.7 | 38.18 |
| 240.4 | 37.16 | 241 | 35.59 | 243.3 | 37.2 |
| 382.2 | 36.04 | 379 | 34.87 | 388.9 | 36.3 |
| 618.1 | 35.01 | 600.1 | 34.29 | 601.5 | 35.62 |
| 979.1 | 34.24 | 953.4 | 33.79 | 986.8 | 34.95 |
| 1495.6 | 33.62 | 1504.7 | 33.34 | 1488.1 | 34.5 |
| 2260.7 | 33.17 | 2266.4 | 33.12 | 2271.7 | 34.09 |
| 3602.8 | 32.72 | 3604.5 | 32.9 | 3609.6 | 33.79 |
| 5720.9 | 32.36 | 5693.4 | 32.76 | 5683.1 | 33.56 |
| 9074.3 | 32.14 | 9015.1 | 32.59 | 9010.1 | 33.34 |
| 14577 | 31.87 | 14565.1 | 32.45 | 14347 | 33.15 |
| 22947.7 | 31.64 | 23319.6 | 32.36 | 23075.3 | 33.02 |
| 26111.9 | 31.6 | 25510.6 | 32.32 | 26019 | 32.98 |

TABLE 23

Mixture Simulsol 301 (surfactant A)/Imbentin (surfactant B)

| | |
|---|---|
| $\sigma_A$ (surface tension of single surfactant A) | 39.9 mN/m |
| $\sigma_B$ (surface tension of single surfactant B) | 37.2 mN/m |
| $\sigma_{A,B}$ (measured surface tension of a mixture of surfactants A and B) | 39.3 mN/m |
| $\sigma_{theor}$ (calculated surface tension of a mixture of surfactants A and B) | 38.6 mN/m |
| synergy | −27.4% |

2.2.12 Dynamic surface tension of Propetal 150 and Propetal 140

Table 24 shows dynamic surface tension of a mixture of Propetal 150 (surfactant A) and Propetal 140 (surfactant B). The calculation according to the above formulas with the surface tension values at 100 ms lead to the results summarized in Table 25.

TABLE 24

Dynamic surface tension σ of a mixture of Propetal 150 and Propetal 140

| Propetal 150 | | Propetal 140 | | Propetal 150 and 140 | |
|---|---|---|---|---|---|
| bubble age/ms | σ/mN/m | bubble age/ms | σ/mN/m | bubble age/ms | σ/mN/m |
| 10 | 51.51 | 10.1 | 50.04 | 9.9 | 51.37 |
| 15.6 | 48.15 | 15.6 | 46.4 | 15.6 | 47.51 |
| 24.9 | 44.07 | 24.8 | 42.41 | 24.8 | 43.74 |
| 39.3 | 40.7 | 39.3 | 39 | 39.3 | 40.38 |
| 62.2 | 38.37 | 62.2 | 36.67 | 62.2 | 38.05 |
| 98.5 | 36.84 | 98.6 | 35.28 | 98.6 | 36.52 |
| 155.6 | 35.68 | 151.8 | 34.34 | 154.2 | 35.49 |
| 254.6 | 34.74 | 238.8 | 33.48 | 245.7 | 34.59 |
| 382.8 | 34.02 | 387.8 | 32.72 | 391.8 | 33.83 |
| 600.5 | 33.3 | 637.5 | 32.18 | 599.9 | 33.34 |
| 972.5 | 32.72 | 958.2 | 31.74 | 969.5 | 32.79 |
| 1477.9 | 32.27 | 1536 | 31.33 | 1469.5 | 32.4 |
| 2271.9 | 31.91 | 2269.9 | 31.1 | 2262.5 | 32.21 |
| 3599.8 | 31.6 | 3595.9 | 30.93 | 3594.5 | 32.04 |
| 5737.8 | 31.33 | 5710.4 | 30.7 | 5710.7 | 31.81 |
| 9029.5 | 31.15 | 9110.8 | 30.61 | 9081.8 | 31.76 |
| 14556.6 | 30.93 | 14321.9 | 30.52 | 14541 | 31.59 |
| 22830.9 | 30.74 | 22740.8 | 30.43 | 23022.7 | 31.49 |
| 25251.2 | 30.74 | 25777.2 | 30.39 | 25853 | 31.49 |

TABLE 25

Mixture Propetal 150 (surfactant A)/Propetal 140 (surfactant B)

| | |
|---|---|
| $\sigma_A$ (surface tension of single surfactant A) | 36.8 mN/m |
| $\sigma_B$ (surface tension of single surfactant B) | 35.2 mN/m |
| $\sigma_{A,B}$ (measured surface tension of a mixture of surfactants A and B) | 36.4 mN/m |
| $\sigma_{theor}$ (calculated surface tension of a mixture of surfactants A and B) | 36.0 mN/m |
| synergy | −22.4% |

2.2.13 Dynamic surface tension of Antarox and Propetal 105

Table 26 shows dynamic surface tension of a mixture of Antarox (surfactant A) and Propetal 105 (surfactant B). The calculation according to the above formulas with the surface tension values at 100 ms lead to the results summarized in Table 27. Table 26: Dynamic surface tension a of a mixture of Antarox and Propetal 105 Antarox Propetal 105 Antarox and Propetal 105

TABLE 26

Dynamic surface tension σ of a mixture of Antarox and Propetal 105

| Antarox | | Propetal 105 | | Antarox and Propetal 105 | |
|---|---|---|---|---|---|
| bubble age/ms | σ/mN/m | bubble age/ms | σ/mN/m | bubble age/ms | σ/mN/m |
| 10 | 60.59 | 10.05 | 48.025 | 10.05 | 54.435 |
| 15.7 | 57.19 | 15.8 | 46.83 | 16.15 | 50.935 |
| 24.9 | 52.43 | 25.65 | 42.555 | 25.25 | 45.62 |
| 39.3 | 48.35 | 39.55 | 39.88 | 39.65 | 42.255 |
| 62.4 | 44.94 | 65.9 | 35.93 | 67.8 | 41.29 |
| 98.8 | 42.33 | 100.45 | 32.945 | 100.1 | 40.035 |
| 157.8 | 40.5 | 157.75 | 33.065 | 154.55 | 38.175 |
| 244.3 | 38.97 | 253.4 | 32.23 | 248.25 | 36.625 |
| 383.8 | 37.85 | 400.45 | 31.585 | 382.1 | 35.03 |
| 606.4 | 36.64 | 605.95 | 30.51 | 613.15 | 34.36 |
| 986.5 | 35.74 | 983.9 | 29.585 | 966.75 | 33.465 |
| 1495 | 34.93 | 1512.8 | 29.065 | 1496.85 | 32.99 |
| 2267.6 | 34.26 | 2271.5 | 28.42 | 2270.2 | 31.825 |
| 3589.2 | 33.95 | 3632.75 | 28.04 | 3604.65 | 31.31 |
| 5687.9 | 33.41 | 5695.7 | 27.55 | 5702 | 30.81 |
| 9065.8 | 33.23 | 9081.35 | 27.41 | 9082.9 | 30.59 |

TABLE 26-continued

Dynamic surface tension σ of a mixture of Antarox and Propetal 105

| Antarox | | Propetal 105 | | Antarox and Propetal 105 | |
|---|---|---|---|---|---|
| bubble age/ms | σ/mN/m | bubble age/ms | σ/mN/m | bubble age/ms | σ/mN/m |
| 14409.1 | 33.01 | 14579.05 | 27.315 | 14603.6 | 30.305 |
| 22621.5 | 32.82 | 23061.2 | 27.275 | 23317 | 30.1 |
| 25251.2 | 32.82 | 25499.65 | 27.25 | 25764.75 | 30.14 |

TABLE 27

Mixture Antarox (surfactant A)/Propetal 105 (surfactant B)

| | |
|---|---|
| $\sigma_A$ (surface tension of single surfactant A) | 42.3 mN/m |
| $\sigma_B$ (surface tension of single surfactant B) | 35.0 mN/m |
| $\sigma_{A,B}$ (measured surface tension of a mixture of surfactants A and B) | 40.0 mN/m |
| $\sigma_{theor}$ (calculated surface tension of a mixture of surfactants A and B) | 48.7 mN/m |
| synergy | −18.5% |

2.2.14 Dynamic surface tension of Propetal 120 and Propetal 105

Table 28 shows dynamic surface tension of a mixture of Propetal 120 (surfactant A) and Propetal 105 (surfactant B). The calculation according to the above formulas with the surface tension values at 100 ms lead to the results summarized in Table 29.

TABLE 28

Dynamic surface tension σ of a mixture of Propetal 120 and Propetal 105

| Propetal 120 | | Propetal 105 | | Propetal 120 and 105 | |
|---|---|---|---|---|---|
| bubble age/ms | σ/mN/m | bubble age/ms | σ/mN/m | bubble age/ms | σ/mN/m |
| 10.05 | 52.58 | 10.05 | 48.025 | 10.3 | 51.465 |
| 15.75 | 50.72 | 15.8 | 46.83 | 15.95 | 48.325 |
| 25.3 | 46.475 | 25.65 | 42.555 | 26 | 43.415 |
| 40.55 | 40.76 | 39.55 | 39.88 | 40.75 | 41.105 |
| 66.2 | 39.5 | 65.9 | 35.93 | 66.1 | 39.195 |
| 101.2 | 39.115 | 100.45 | 32.945 | 105.3 | 37.45 |
| 164.6 | 37.1 | 157.75 | 33.065 | 155.05 | 37.67 |
| 252.25 | 36.155 | 253.4 | 32.23 | 245.8 | 35.295 |
| 383.35 | 34.435 | 400.45 | 31.585 | 394.65 | 34.465 |
| 614.9 | 33.98 | 605.95 | 30.51 | 625.45 | 33.275 |
| 982.2 | 32.995 | 983.9 | 29.585 | 969.1 | 32.8 |
| 1482.05 | 32.01 | 1512.8 | 29.065 | 1477.55 | 32.555 |
| 2266.4 | 31.74 | 2271.5 | 28.42 | 2293.35 | 31.255 |
| 3613.9 | 31.355 | 3632.75 | 28.04 | 3614.95 | 30.65 |
| 5737.45 | 31.16 | 5695.7 | 27.55 | 5718.3 | 29.845 |
| 9063.95 | 31.02 | 9081.35 | 27.41 | 9104.55 | 29.665 |
| 14395.65 | 30.89 | 14579.05 | 27.315 | 14453.65 | 29.57 |
| 23264.7 | 30.795 | 23061.2 | 27.275 | 23002.6 | 29.44 |
| 25938.45 | 30.795 | 25499.65 | 27.25 | 25289.1 | 29.33 |

TABLE 29

Mixture Propetal 120 (surfactant A)/Propetal 105 (surfactant B)

| | |
|---|---|
| $\sigma_A$ (surface tension of single surfactant A) | 38.6 mN/m |
| $\sigma_B$ (surface tension of single surfactant B) | 34.4 mN/m |
| $\sigma_{A,B}$ (measured surface tension of a mixture of surfactants A and B) | 37.7 mN/m |
| $\sigma_{theor}$ (calculated surface tension of a mixture of surfactants A and B) | 36.5 mN/m |
| synergy | −28.6% |

2.3 Cleaning of a Metal Surface

Samples of metal surfaces as described in section 1.6 were cleaned with cleaning solutions according to the invention and two comparative cleaning solutions. One cleaning solution according to the invention (Example of the invention 1 in FIG. 4) contained a mixture of Marlox (first surfactant, 1000 ppm) and Surfaline 1309 L (second surfactant ii), 2550 ppm). Further components of the cleaning solution according to the invention and their concentrations therein were as outlined in section 1.2 herein with the exception of ethylene glycol monobutylether which was not contained in this cleaning solution. Another cleaning solution according to the invention (Example of the invention 2 in FIG. 4) contained a mixture of Propetal 105 (first surfactant, 500 ppm) and Genapol UD 079 (second surfactant ii), 1500 ppm). The cleaning solution further contained glycolic acid (a carboxylic acid) having a concentration of 0.48 wt.-%, and ethylene glycol monobutylether having a concentration of 0.1 wt.-%. One comparative cleaning solution (Comparative Example 1 in FIG. 4) contained the surfactant Tegotens EC 11 (Evonik Industries AG; CAS-No. 67922-59-2; fatty alcohol ethoxylate, end-capped with butylene oxide; 350 ppm) and no further surfactant. This comparative cleaning solution further contained about 10 wt.-% sulfuric acid, about 0.5 wt.-% hydroxyacetic acid, and about 0.075 wt.-% diethyleneglycol monobutylether. Another comparative cleaning solution (Comparative Example 2 in FIG. 4) contained two surfactants: 700 ppm Amonyl 265 BA (Seppic GmbH; CAS-No. 68424-94-2; Coco alkyl dimethyl betain, amphoteric surfactant) and 1000 ppm Marlox. This comparative cleaning solution further contained about 10 wt.-% sulfuric acid, about 0.48 wt.-% hydroxyacetic acid, and about 0.1 wt.-% ethyleneglycol monobuthylether. FIG. 4 shows cleaning results. Best cleaning results (ranking 4) were obtained with the cleaning solutions of the invention. No or nearly no finger prints were visible any more on the sample cleaned with the solutions according to invention. The sample is perfectly cleaned. In contrast, the samples treated with the comparative cleaning solutions clearly show finger prints.

2.4 Cleaning, Rinsing and Metallization

Quality of cleaning, quality of rinsing until removal of surfactant residues and metallization were determined by an ICD test.

For a void free production (e.g. for blind micro via filling) it is very important that no contaminations and no residues of cleaner components are remaining on the copper surface after cleaning and rinsing. Especially surfactants could stick on the copper surface by adsorption and block the surface. This could lead to effects similar to passivation and resulting in voids during copper plating. To check whether a cleaner has good cleaning properties and is good rinsable ICD tests were performed on samples cleaned with different cleaners and metallized afterwards as described in section 1.7. One sample was cleaned with a cleaning solution according to invention containing a mixture of Propetal 105 (first surfactant, 500 ppm) and Genapol UD 079 (second surfactant ii), 1500 ppm). The cleaning solution further contained glycolic acid (a carboxylic acid) having a concentration of 0.48 wt.-%, and ethylene glycol monobutylether having a concentration of 0.1 wt.-%. Another sample was cleaned with the comparative cleaning solution also used in Comparative Example 1 (FIG. 4) of section 2.3. Any not removed contaminations or adsorbed surfactants will reduce the adhesion between electrodeposited copper layer and electrolessly deposited and cleaned copper surface, in particular in the through holes, and result in defects as described in section 1.7. The ICD tests were performed as described in section 1.7.

FIG. 5 shows the cross-section of a through hole originating from a sample cleaned with the cleaning solution according to invention. A void free inner layer connection is obtained after six times solder shock at 326° C. The electrodeposited copper layer did not delaminate from the subjacent electrolessly deposited and cleaned copper layer. The adhesion obtained between the electrodeposited and the electrolessly deposited copper layers is excellent after treating the electrolessly deposited copper surface with the cleaning solution of the invention.

Results of the ICD test are summarized in Table 30. The comparative example shows results with a comparative cleaning solution comprising only one surfactant. The results are presented as number of defects found per 100 positions at interconnection areas of samples inspected (ICDs/100 inner layers). The fewer defects occurred in a sample the better was the cleaning and the rinsability. Best results were obtained with samples treated with the cleaning solution of the invention.

TABLE 30

Results of the ICD test

| | Cleaning solution | ICDs/100 inner layers |
|---|---|---|
| according to invention | cleaning solution containing first surfactant and second surfactant ii): Propetal 105 and Genapol UD 079 | |
| | Sample 3: 6 × 326° C. | 0 |
| | Sample 2: 9 × 288° C. | 0 |
| | Sample 1: 6 × 288° C. | 0 |
| comparative | cleaning solution containing a single surfactant | |
| | Sample 3: 6 × 326° C. | 14.1 |
| | Sample 2: 9 × 288° C. | 15.6 |
| | Sample 1: 6 × 288° C. | 0 |

The invention claimed is:

1. Cleaning solution for cleaning and/or wetting metal surfaces, comprising
   at least one acid,
   a first surfactant, which is an alkyl-poly(ethyleneglycol-co-propyleneglycol)-ether having a cloud point of ≤25° C., and
   a second surfactant, which is selected from the group consisting of
   i) an alkyl-poly(ethyleneglycol-co-propyleneglycol)-ether having a cloud point of ≥30° C., and
   ii) an alkyl-polyethyleneglycol-ether having a cloud point of ≥45° C.
   wherein the cloud points are determined according to European Standard EN 1890:2006, item 8.2, procedure A of German Version, with the modification that 10 wt % $H_2SO_4$ is used as solvent and that the concentration of the surfactant is 1000 mg/L, wherein the at least one acid is an inorganic acid, and/or methane sulfonic acid, and wherein the pH value of the cleaning solution of the invention is below 2.0,
   wherein the concentration of the first surfactant is 50-5000 mg/L.

2. Cleaning solution according to claim 1, wherein the mass ratio of the first surfactant to the second surfactant is in the range of 1 : 0.5 to 1 : 10.

3. Cleaning solution according to claim 1, wherein the concentration of the second surfactant is 50-20000 mg/L.

4. Cleaning solution according to claim 1, wherein in the first surfactant the alkyl of the alkyl-poly(ethyleneglycol-co-propyleneglycol)-ether has 6 to 30 carbon atoms, wherein the first surfactant can comprise a mixture of molecules with different alkyl groups.

5. Cleaning solution according to claim 1, wherein in the second surfactant i) the alkyl of the alkyl-poly(ethyleneglycol-co-propyleneglycol)-ether has 6 to 22 carbon atoms, wherein the second surfactant i) can comprise a mixture of molecules with different alkyl groups.

6. Cleaning solution according to claim 1, wherein in the second surfactant ii) the polyethyleneglycol-moiety consists of 5 to 22 ethyleneglycol-units.

7. Cleaning solution according to claim 1, wherein in the second surfactant ii) the alkyl is one or more of a branched alkyl group.

8. Cleaning solution according to claim 1, further comprising an alkyl glycolether.

9. Cleaning solution according to claim 1, wherein the second surfactant i) has a molecular weight in the range of 500-1200 g/mol.

\* \* \* \* \*